United States Patent
Park

(10) Patent No.: US 10,777,495 B2
(45) Date of Patent: Sep. 15, 2020

(54) PRINTED CIRCUIT BOARD AND SEMICONDUCTOR PACKAGE INCLUDING THE SAME

(71) Applicant: SAMSUNG ELECTRONICS CO., LTD., Suwon-si (KR)

(72) Inventor: Soojae Park, Asan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/126,221

(22) Filed: Sep. 10, 2018

(65) Prior Publication Data
US 2019/0252306 A1 Aug. 15, 2019

(30) Foreign Application Priority Data
Feb. 12, 2018 (KR) .................. 10-2018-0016932

(51) Int. Cl.
*H01L 23/48* (2006.01)
*H01L 23/52* (2006.01)
(Continued)

(52) U.S. Cl.
CPC ...... *H01L 23/49827* (2013.01); *H01L 21/486* (2013.01); *H01L 21/6835* (2013.01); *H01L 23/145* (2013.01); *H01L 23/3128* (2013.01); *H01L 23/49838* (2013.01); *H01L 23/49866* (2013.01); *H01L 24/16* (2013.01); *H01L 24/32* (2013.01); *H01L 24/48* (2013.01); *H01L 24/73* (2013.01); *H01L 25/105* (2013.01); *H01L 2221/68318* (2013.01); *H01L 2221/68345* (2013.01); *H01L 2224/16227* (2013.01); *H01L 2224/32225* (2013.01); *H01L 2224/48091* (2013.01); *H01L 2224/48106* (2013.01); *H01L 2224/48228* (2013.01); *H01L 2224/73265* (2013.01)

(58) Field of Classification Search
CPC ....... H01L 2924/0665; H01L 23/49894; H01L 25/0657; H01L 23/49548; H01L 23/49816; H01L 23/49833; H01L 23/49838; H01L 23/528; H01L 23/53204; H01L 23/53233; H01L 23/5384; H01L 24/33
USPC ........................................................ 257/753
See application file for complete search history.

(56) References Cited

U.S. PATENT DOCUMENTS 5,912,066 A 6/1999 Takahashi
7,378,326 B2 5/2008 Ahn et al.
(Continued)

FOREIGN PATENT DOCUMENTS

KR 10-1039772 B1 6/2011
KR 10-1162506 B1 7/2012

OTHER PUBLICATIONS

Nilesh Badwe et al., "Interfacial fracture strength and toughness of copper/epoxy-resin interfaces", Acta Materialia, vol. 103 Elsevier, 2016, pp. 512-518.
(Continued)

*Primary Examiner* — Theresa T Doan
(74) *Attorney, Agent, or Firm* — Sughrue Mion, PLLC

(57) ABSTRACT

A printed circuit board comprises an epoxy-containing member, a first copper pattern disposed adjacent to the epoxy-containing member, and a first adhesion promoter layer interposed between the epoxy-containing member and the first copper pattern.

17 Claims, 20 Drawing Sheets

(51) Int. Cl.
*H01L 23/498* (2006.01)
*H01L 23/31* (2006.01)
*H01L 21/48* (2006.01)
*H01L 23/14* (2006.01)
*H01L 21/683* (2006.01)
*H01L 25/10* (2006.01)
*H01L 23/00* (2006.01)

(56) References Cited

U.S. PATENT DOCUMENTS

| | | |
|---|---|---|
| 8,122,599 B2 | 2/2012 | Ryu |
| 9,338,896 B2 | 5/2016 | Owei et al. |
| 9,345,149 B2 | 5/2016 | Wei et al. |
| 2005/0186793 A1* | 8/2005 | Omoto .............. H01L 21/76846 438/687 |
| 2006/0196691 A1* | 9/2006 | Ahn ....................... H05K 1/162 174/256 |
| 2009/0107699 A1 | 4/2009 | Ryu |
| 2012/0073863 A1 | 3/2012 | Kang et al. |
| 2012/0125514 A1 | 5/2012 | Wei et al. |
| 2014/0030425 A1 | 1/2014 | Owei et al. |
| 2018/0182709 A1* | 6/2018 | Jaywant ............ H01L 23/49894 |

OTHER PUBLICATIONS

Allen F. Horn III et al., "Conductor Profile Effects on the Propagation Constant of Microstrip Transmission Lines", IEEE, 2010, pp. 868-871.

David C. Miller et al., "The mechanical robustness of atomic-layer- and molecular-layer-deposited coatings on polymer substrates", Journal of Applied Physics vol. 105, American Institute of Physics, 2009, 13 pages.

Yuriy Shlepnev et al., "Practical methodology for analyzing the effect of conductor roughness on signal losses and dispersion in interconnects", DesignCon 2012, pp. 1-25.

Eric Bogatin, "Rule of Thumb #4: Skin depth of copper", EDN Network, Jan. 3, 2014, 3 pages.

Jiong Liu et al., "Fracture behavior of an epoxy/aluminum interface reinforced by sol-gel coatings", J. Adhesion Sci. Technol., vol. 20, No. 4, VSP, 2006, pp. 277-305.

* cited by examiner

PRINTED CIRCUIT BOARD AND SEMICONDUCTOR PACKAGE INCLUDING THE SAME

CROSS-REFERENCE TO RELATED APPLICATION

This application claims priority from Korean Patent Application No. 10-2018-0016932 filed on Feb. 12, 2018, in the Korean Intellectual Property Office, the disclosure of which is incorporated herein by reference in its entirety.

BACKGROUND

1. Field

Apparatuses and methods consistent with embodiments relate to a printed circuit board and a semiconductor package including the same.

2. Description of Related Art

A printed circuit board can be used as a package substrate of a semiconductor package or a board substrate on which semiconductor packages are mounted. With the development of the electronic industry, electronic products have increasing demands for high performance, high speed, and compact size. In response to this trend, conductive patterns of a printed circuit board are becoming finer and finer.

SUMMARY

According to embodiments, a printed circuit board includes an epoxy-containing member, a first copper pattern disposed adjacent to the epoxy-containing member, and a first adhesion promoter layer interposed between the epoxy-containing member and the first copper pattern.

According to embodiments, a semiconductor package includes a package substrate, and a semiconductor chip mounted on the package substrate. The package substrate includes an epoxy-containing member, a copper pattern disposed adjacent to the epoxy-containing member, and an adhesion promoter layer interposed between the epoxy-containing member and the copper pattern.

According to embodiments, a printed circuit board includes a first substrate body, a first conductive pattern disposed on the first substrate body, a passivation layer covering the first substrate body and the first conductive pattern, and a first adhesion promoter layer interposed between the first substrate body and the first conductive pattern.

According to embodiments, a printed circuit board includes a first substrate body, a first conductive pattern disposed on the first substrate body, a through via penetrating through the first substrate body and electrically connected to the first conductive pattern, and a first adhesion promoter layer interposed between the through via and the first substrate body.

DETAILED DESCRIPTION OF EMBODIMENTS

Embodiments of inventive concepts provide a printed circuit board having improved reliability and capable of increasing signal transmission speeds.

Embodiments of inventive concepts provide a semiconductor package having improved reliability and capable of increasing signal transmission speeds.

Figure 1:
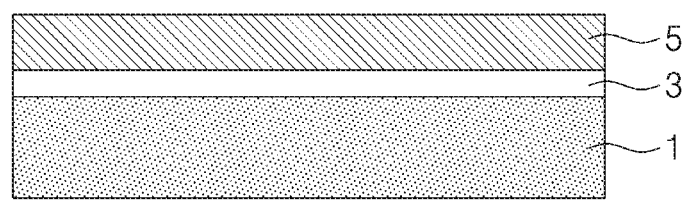
FIG. 1 illustrates a cross-sectional view partially showing a printed circuit board according to embodiments of inventive concepts.

FIG. 1 illustrates a cross-sectional view partially showing a printed circuit board according to embodiments of inventive concepts.

Referring to FIG. 1, a printed circuit board may include an epoxy-containing member 1, a copper pattern 5 adjacent to the epoxy-containing member 1, and an adhesion promoter layer 3 between the epoxy-containing member 1 and the copper pattern 5. The epoxy-containing member 1 may be at least one out of a prepreg layer, a photosensitive solder resist layer, and a mold layer. The copper pattern 5 may be at least one out of a conductive pad, a conductive line, a redistribution line, and a through via that are included in the integrated circuit board. The adhesion promoter layer 3 may be an aluminum oxide layer. The adhesion promoter layer 3 may have a thickness ranging from about 0.1 nm to about 100 nm. The adhesion promoter layer 3 may increase an adhesive force between the epoxy-containing member 1 and the copper pattern 5, thereby solving delamination therebetween. Accordingly, the printed circuit board may improve in reliability, and when the printed circuit board is used for a semiconductor package, the semiconductor package may also improve in reliability.

When no adhesion promoter layer 3 is provided, the copper pattern 5 may be treated to have a large surface roughness to increase an adhesive force between the copper pattern 5 and the epoxy-containing member 1. An alternating current may flow along a surface of a conductive pattern, and in the case of the copper pattern 5 having a large surface roughness, the path of the alternating current may consequently become increased to decrease an electrical signal transmission speed. In contrast, according to inventive concepts, because the adhesion promoter layer 3 increases an adhesive force between the copper pattern 5 and the epoxy-containing member 1, the copper pattern 5 may not be required to have a large surface roughness. In embodiments, the copper pattern 5 may have an extremely flat surface in contact with the adhesion promoter layer 3, the ten-point mean roughness (Rz) of which surface may fall within a range from about 0 μm to 0.2 μm. It thus may be possible to increase a signal transmission speed. In addition, because the copper pattern 5 becomes small-sized, pattern collapse may increasingly occur when a surface treatment is performed to cause the copper pattern 5 to have a large surface roughness. However, according to inventive concepts, the adhesion promoter layer 3 may cause that the copper pattern 5 does not need to be treated to have a large surface roughness, which fact may prevent pattern collapse. The printed circuit board may then have improved reliability.

Figure 2:
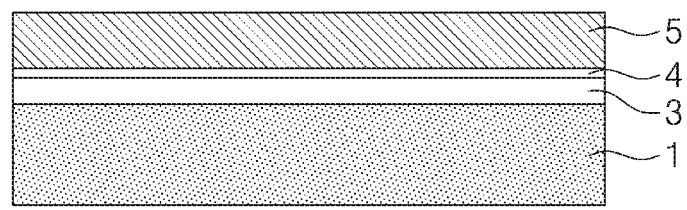
FIG. 2 illustrates a cross-sectional view partially showing a printed circuit board according to embodiments of inventive concepts.

FIG. 2 illustrates a cross-sectional view partially showing a printed circuit board according to embodiments of inventive concepts.

Referring to FIG. 2, an adhesion assist layer 4 may be additionally interposed between the adhesion promoter layer 3 and the copper pattern 5. The adhesion assist layer 4 may be, for example, at least one out of a metal layer and a metal oxide layer. In embodiments, the adhesion assist layer 4 may include at least one out of titanium, titanium oxide, tungsten, cobalt, chromium, and copper oxide. The adhesion assist layer 4 may increase an adhesion force between the copper pattern 5 and the adhesion promoter layer 3.

Figure 3:
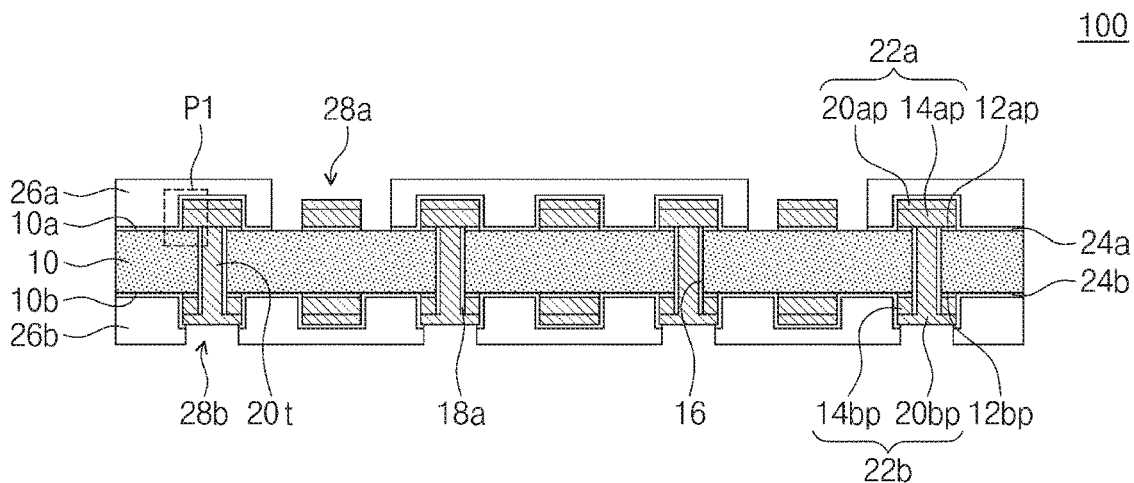
FIG. 3 illustrates a cross-sectional view showing a printed circuit board according to embodiments of inventive concepts.
Figure 4:
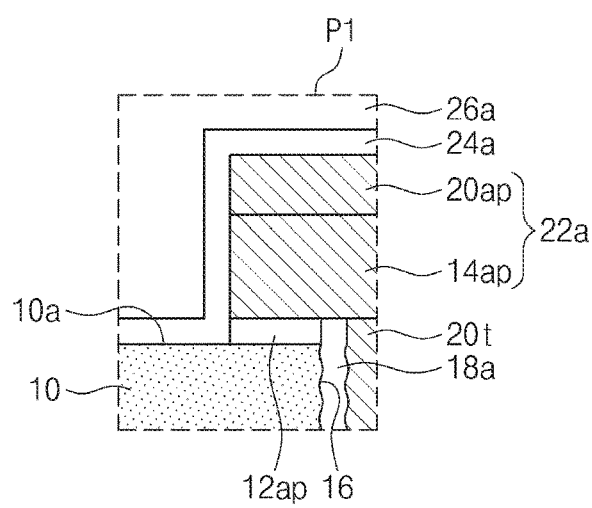
FIGS. 4 and 5 illustrate enlarged cross-sectional views showing section P1 of FIG. 1, according to embodiments of inventive concepts.
Figure 5:
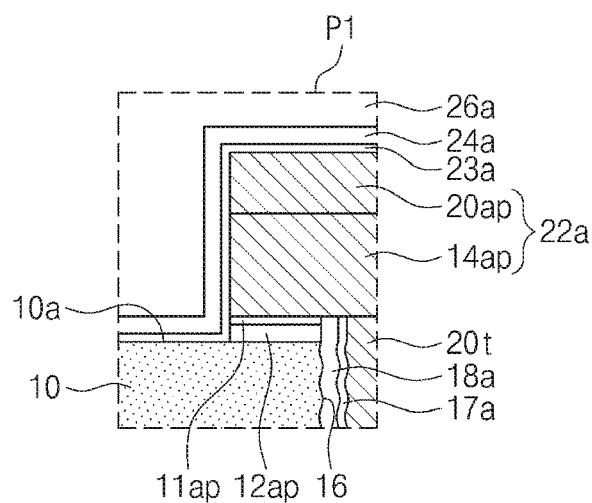

FIG. 3 illustrates a cross-sectional view showing a printed circuit board according to embodiments of inventive concepts. FIGS. 4 and 5 illustrate enlarged cross-sectional views showing section P1 of FIG. 1, according to embodiments of inventive concepts.

Referring to FIGS. 3 and 4, a printed circuit board 100 may include a substrate body 10. The substrate body 10 may include a top surface 10a and a bottom surface 10b facing each other. The substrate body 10 may be formed of, for example, an epoxy-containing layer. For example, the substrate body 10 may include, but not particularly limited to, at least one out of a thermosetting resin such as epoxy resin, a thermoplastic resin such as polyimide, a resin (e.g., prepreg) in which a thermosetting or thermoplastic resin is impregnated with a reinforcement such as glass fiber and/or inorganic filler, and a photo-curable resin.

The top surface 10a of the substrate body 10 may be provided thereon with upper conductive patterns 22a that are adjacently disposed to each other. The upper conductive patterns 22a may be formed of, for example, copper. Each of the upper conductive patterns 22a may include a first sub-upper conductive pattern 14ap and a second sub-upper conductive pattern 20ap that are sequentially stacked. The bottom surface 10b of the substrate body 10 may be provided thereon with lower conductive patterns 22b that are adjacently disposed to each other. The lower conductive patterns 22b may be formed of, for example, copper. Each of the lower conductive patterns 22b may include a first sub-lower conductive pattern 14bp and a second sub-lower conductive pattern 20bp that are sequentially stacked. The substrate body 10 may be penetrated with through vias 20t. The substrate body 10 may have through holes 16 therein. The through vias 20t may be disposed in the through holes 16. The through vias 20t may electrically connect ones of the upper conductive patterns 22a to ones of the lower conductive patterns 22b. The through vias 20t may be formed of copper. The through via 20t may penetrate the first sub-lower conductive pattern 14bp and may be unitarily connected to the second sub-lower conductive pattern 20bp.

An upper passivation layer 26a may cover the top surface 10a of the substrate body 10 and ones of the upper conductive patterns 22a. The upper passivation layer 26a may include an epoxy-containing layer. For example, the upper passivation layer 26a may be a photosensitive solder resist (PSR) layer. The upper passivation layer 26a may include, for example, epoxy, acryl, or inorganic filler. The upper passivation layer 26a may include upper openings 28a that expose ones of the upper conductive patterns 22a and portions of the top surface 10a of the substrate body 10. A lower passivation layer 26b may cover the bottom surface 10b of the substrate body 10 and ones of the lower conductive patterns 22b. Likewise the upper passivation layer 26a, the lower passivation layer 26b may include an epoxy-containing layer. The lower passivation layer 26b may also be a photosensitive solder resist (PSR) layer. The lower passivation layer 26b may include lower openings 28b that expose ones of the lower conductive patterns 22b.

A first upper adhesion promoter pattern 12ap (or, i.e., a second adhesion promoter layer) may be interposed between the top surface 10a of the substrate body 10 and the upper conductive patterns 22a, thereby increasing adhesive forces between the substrate body 10 and the upper conductive patterns 22a. The upper conductive patterns 22a may thus be prevented from delamination from the top surface 10a of the substrate body 10. The first upper adhesion promoter pattern 12ap may be, for example, an aluminum oxide layer. A second upper adhesion promoter layer 24a (or, i.e., a first or second adhesion promoter layer) may be interposed between the upper passivation layer 26a and the upper conductive patterns 22a. The second upper adhesion promoter layer 24a may extend to be interposed between the upper passivation layer 26a and the substrate body 10. The second upper adhesion promoter layer 24a may be formed of, for example, an aluminum oxide layer.

The upper opening 28a may expose a sidewall of the upper passivation layer 26a and a sidewall of the second upper adhesion promoter layer 24a. The first upper adhesion promoter pattern 12ap may be exposed on its sidewall under the upper conductive pattern 22a exposed to the upper opening 28a.

A first lower adhesion promoter pattern 12bp (or, i.e., a second adhesion promoter layer) may be interposed between the bottom surface 10b of the substrate body 10 and the lower conductive patterns 22b, thereby increasing adhesive forces between the substrate body 10 and the lower conductive patterns 22b. Therefore, the lower conductive patterns 22b may be prevented from delamination from the bottom surface 10b of the substrate body 10. The first lower adhesion promoter pattern 12bp may be, for example, an aluminum oxide layer. A second lower adhesion promoter layer 24b (or, i.e., a second or third adhesion promoter layer) may be interposed between the lower passivation layer 26b and the lower conductive patterns 22b. The second lower adhesion promoter layer 24b may extend to be interposed between the lower passivation layer 26b and the substrate body 10. The second lower adhesion promoter layer 24b may be formed of, for example, an aluminum oxide layer. The lower opening 28b may expose a sidewall of the lower passivation layer 26b and a sidewall of the second lower adhesion promoter layer 24b.

Referring to FIGS. 3 and 4, a via adhesion promoter pattern 18a (i.e., a first or third adhesion promoter layer) may be interposed between the through via 20t and the substrate body 10. The via adhesion promoter pattern 18a may be formed of, for example, an aluminum oxide layer. The via adhesion promoter pattern 18a may increase an adhesive force between the through via 20t and the substrate body 10. The via adhesion promoter pattern 18a may also be disposed in the through hole 16. The through hole 16 may be formed by laser drilling. The through hole 16 may then have a relatively large surface roughness on its inner side surface. For example, the through hole 16 may have an uneven inner side surface. The via adhesion promoter pattern 18a may have a side surface that is also uneven along a profile of the inner side surface of the through hole 16. The via adhesion promoter pattern 18a may penetrate the first lower adhesion promoter pattern 12bp and the first sub-lower conductive pattern 14bp, thereby in contact with the second sub-lower conductive pattern 20bp.

Referring to FIG. 5, a via adhesion assist pattern 17a may be interposed between the via adhesion promoter pattern 18a and the through via 20t. A first upper adhesion assist pattern flap may be interposed between the upper conductive pattern 22a and the first upper adhesion promoter pattern 12ap. A second upper adhesion assist layer 23a may be interposed between the upper conductive pattern 22a and the second upper adhesion promoter layer 24a. Each of the via adhesion assist pattern 17a, the first upper adhesion assist pattern 11ap, and the second upper adhesion assist layer 23a may be, for example, at least one out of a metal layer and a metal oxide layer. In embodiments, each of the via adhesion assist pattern 17a, the first upper adhesion assist pattern 11ap, and the second upper adhesion assist layer 23a may include at least one out of titanium, titanium oxide, tungsten, cobalt, chromium, and copper oxide.

FIGS. 6, 7, 8, 9, 10, 11, 12, 13, 14 and 15 illustrate cross-sectional views showing a method of fabricating a printed circuit board having the cross-section of FIG. 3.

Figure 6:
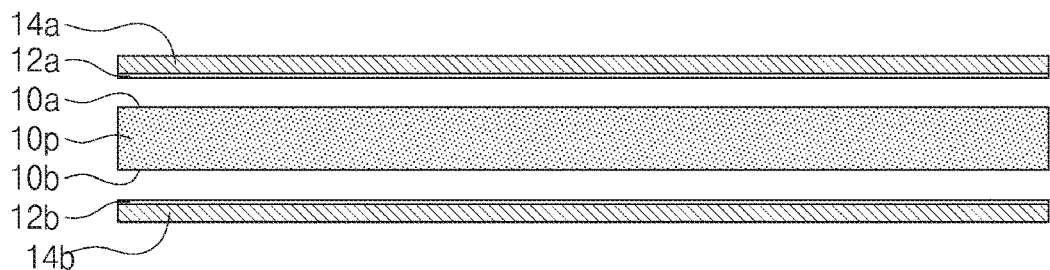
FIGS. 6, 7, 8, 9, 10, 11, 12, 13, 14 and 15 illustrate cross-sectional views showing a method of fabricating a printed circuit board having the cross-section of FIG. 3.
Figure 7:
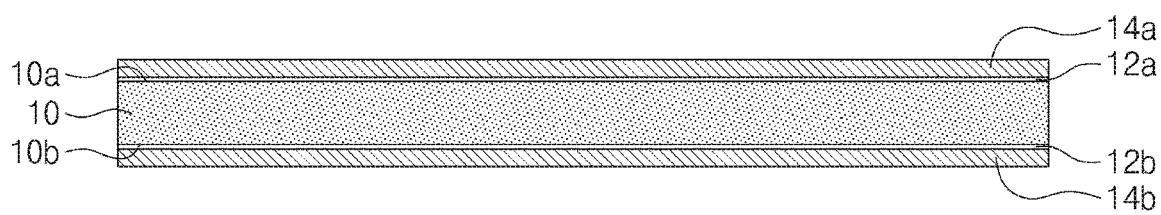

Referring to FIGS. 6 and 7, a sputtering process or the like may be performed to deposit a first upper adhesion promoter layer 12a on a bottom surface of a first sub-upper conductive layer 14a. A sputtering or the like may be performed to deposit a first lower adhesion promoter layer 12b on a top surface of a first sub-lower conductive layer 14b. A preliminary substrate body 10p may be prepared. For example, copper may be used to form the first sub-upper conductive layer 14a and the first sub-lower conductive layer 14b. The first upper adhesion promoter layer 12a and the first lower adhesion promoter layer 12b may be formed of an aluminum oxide layer. The preliminary substrate body 10p may be a prepreg in a B-stage state. The preliminary substrate body 10p may be placed on the first sub-lower conductive layer 14b on which the first lower adhesion promoter layer 12b is formed, and may be placed thereon with the first sub-upper conductive layer 14a on which the first upper adhesion promoter layer 12a is formed. Pressure and heat may be applied upward and downward such that the preliminary substrate body 10p may be cured into a substrate body 10, and at the same time, the substrate body 10 may be attached thereto with the first sub-lower conductive layer 14b and the first sub-upper conductive layer 14a. The first upper adhesion promoter layer 12a and the first lower adhesion promoter layer 12b may cause the first sub-upper conductive layer 14a and the first sub-lower conductive layer 14b to sufficiently adhere to the substrate body 10. The substrate body 10 may have a top surface 10a and a bottom surface 10b as shown in FIG. 7, which may correspond to top and bottom surfaces 10a and 10b of the preliminary substrate body 10p shown in FIG. 6.

Figure 8:
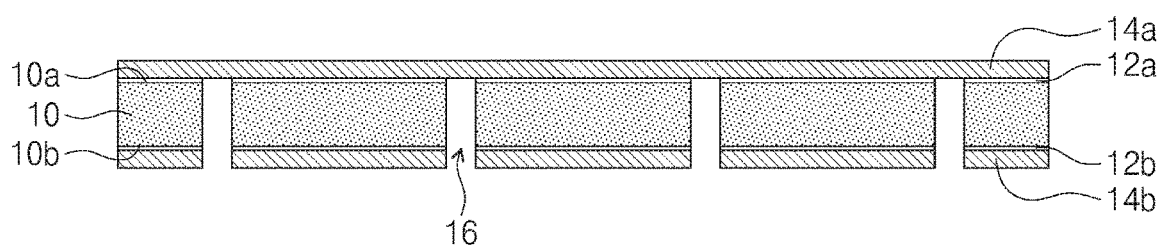

Referring to FIG. 8, a laser drilling process may be performed to successively remove the first sub-lower conductive layer 14b, the first lower adhesion promoter layer 12b, the substrate body 10, and the first upper adhesion promoter layer 12a, thereby forming a through hole 16 that exposes the bottom surface of the first sub-upper conductive layer 14a. The laser drilling process may cause the through hole 16 to have a sidewall that is more uneven than the top and bottom surfaces 10a and 10b of the substrate body 10.

Figure 9:
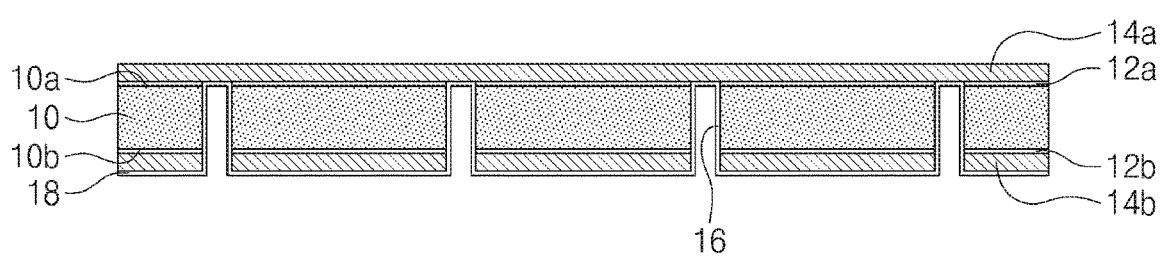

Referring to FIG. 9, a via adhesion promoter layer 18 may be conformally formed on an entire bottom surface of the first sub-lower conductive layer 14b. The via adhesion promoter layer 18 may be formed of, for example, an aluminum oxide layer obtained by a deposition process such as sputtering. The via adhesion promoter layer 18 may be in contact with the sidewall of the through hole 16 and the bottom surface of the first sub-upper conductive layer 14a.

Figure 10:
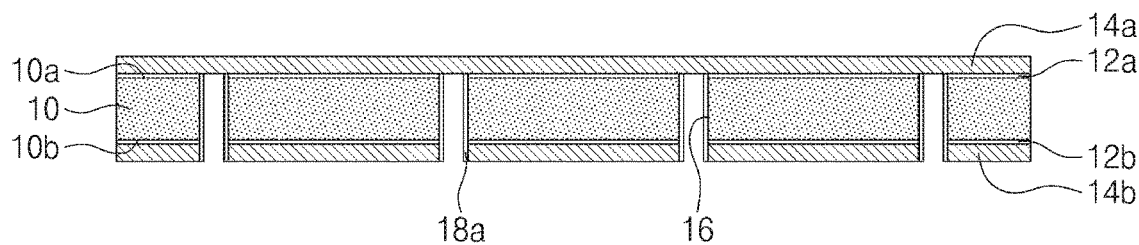

Referring to FIG. 10, an anisotropic etching process may be performed to remove the via adhesion promoter layer 18 from the bottom surface of the first sub-lower conductive layer 14b and the bottom surface of the first sub-upper conductive layer 14a, which removal may form a via adhesion promoter pattern 18a covering the sidewall of the through hole 16.

Figure 11:
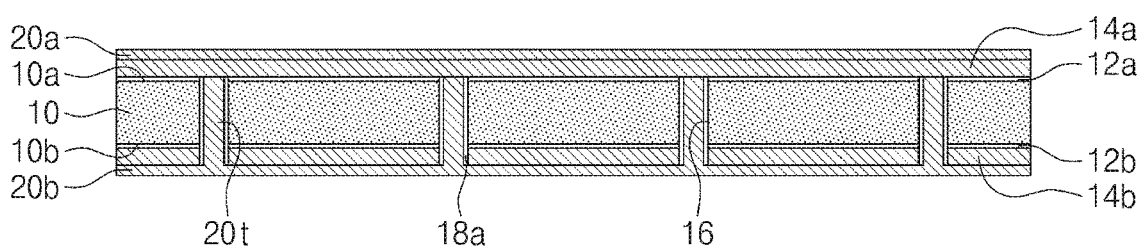

Referring to FIG. 11, an electroless plating process and an electroplating process may be performed to form a second sub-lower conductive layer 20b on the bottom surface of the first sub-lower conductive layer 14b. A through via 20t may also be formed in the through hole 16 when the second sub-lower conductive layer 20b is formed. In addition, a second sub-upper conductive layer 20a may be formed on a top surface of the first sub-upper conductive layer 14a.

Copper may be used to form the second sub-upper conductive layer 20a, the second sub-lower conductive layer 20b, and the through via 20t.

Figure 12:
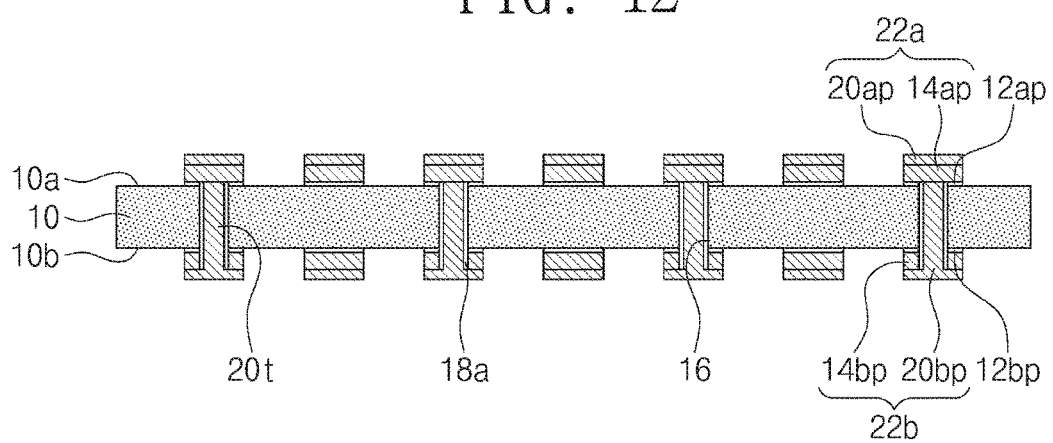

Referring to FIG. 12, an etching process may be performed to sequentially pattern the second sub-upper conductive layer 20a, the first sub-upper conductive layer 14a, and the first upper adhesion promoter layer 12a, thereby partially exposing the top surface 10a of the substrate body 10 and simultaneously forming a first adhesion promoter pattern 12ap, a first sub-upper conductive pattern 14ap, and a second sub-upper conductive pattern 20ap that are sequentially stacked. The first sub-upper conductive pattern 14ap and the second sub-upper conductive pattern 20ap may constitute an upper conductive pattern 22a. The upper conductive pattern 22a may be formed in plural. In addition, the second sub-lower conductive layer 20b, the first sub-lower conductive layer 14b, and the first lower adhesion promoter layer 12b may be sequentially patterned to partially expose the bottom surface 10b of the substrate body 10 and at the same time to form a first lower adhesion promoter pattern 12bp, a first sub-lower conductive pattern 14bp, and a second sub-lower conductive pattern 20bp that are sequentially stacked. The first sub-lower conductive pattern 14bp and the second sub-lower conductive pattern 20bp may constitute a lower conductive pattern 22b. The lower conductive pattern 22b may be formed in plural.

Figure 13:
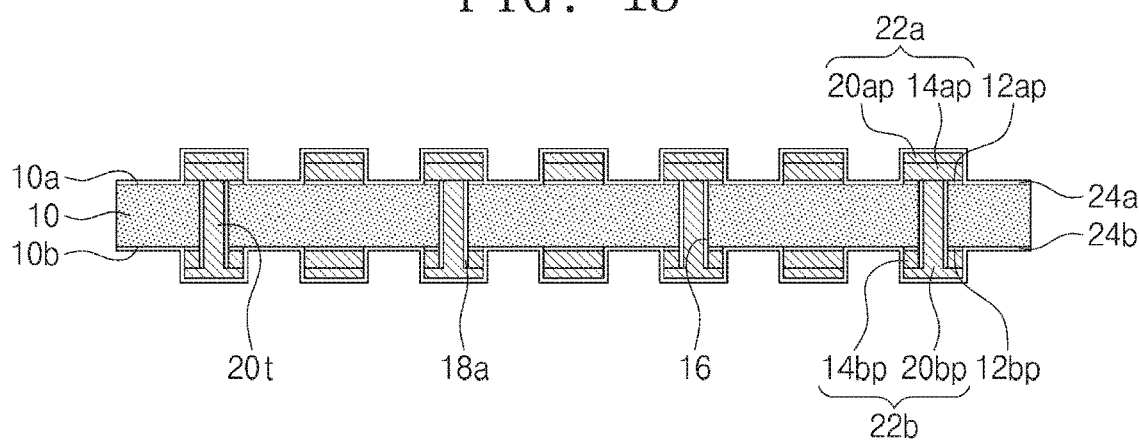

Referring to FIG. 13, a deposition process such as sputtering may be performed to conformally form a second upper adhesion promoter layer 24a on the top surface 10a of the substrate body 10. A deposition process such as sputtering may be performed to conformally form a second lower adhesion promoter layer 24b on the bottom surface 10b of the substrate body 10.

Figure 14:
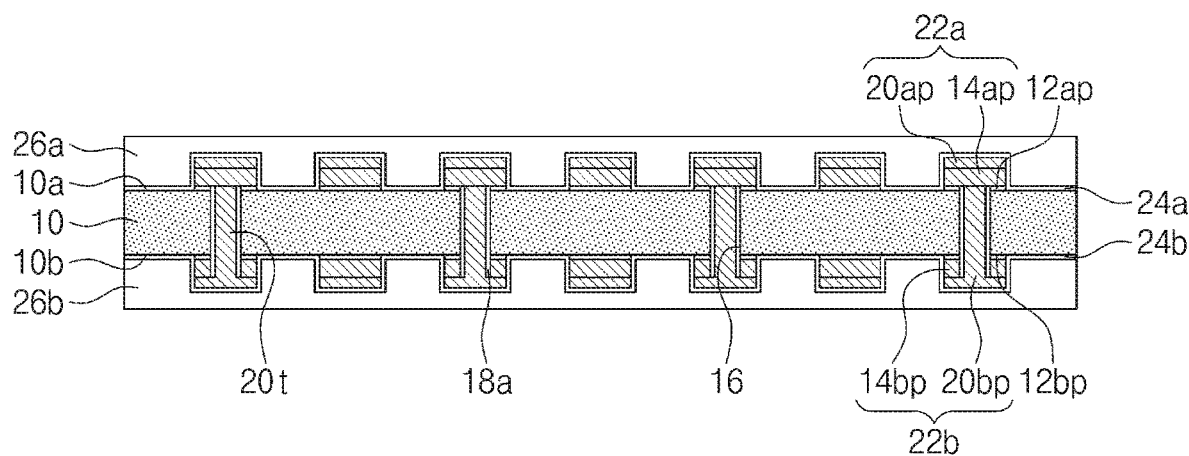

Referring to FIG. 14, an upper passivation layer 26a may be formed on the top surface 10a of the substrate body 10. A lower passivation layer 26b may be formed on the bottom surface 10b of the substrate body 10. The upper and lower passivation layers 26a and 26b may be formed of a photosensitive solder resist layer. The upper and lower passivation layers 26a and 26b may be formed by a coating process and a dry baking process.

Figure 15:
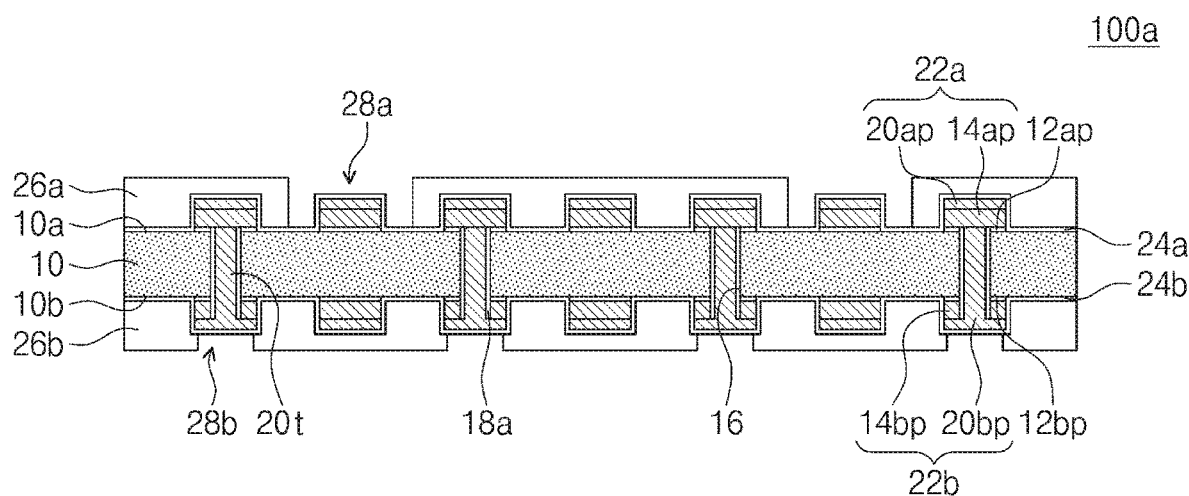

Referring to FIG. 15, exposure and development processes may be performed to partially remove the upper passivation layer 26a to form upper openings 28a, and to partially remove the lower passivation layer 26b to form lower openings 28b. The upper openings 28a may expose the second upper adhesion promoter layer 24a, and the lower openings 28b may expose the second lower adhesion promoter layer 24b.

Referring back to FIG. 3, the second upper adhesion promoter layer 24a exposed to the upper openings 28a may be removed to expose ones of the upper conductive patterns 22a. The second lower adhesion promoter layer 24b exposed to the lower openings 28b may be removed to expose ones of the lower conductive patterns 22b. Through the processes above, a printed circuit board 100 may be fabricated as shown in FIG. 3.

A printed circuit board 100a of FIG. 15 may be used as it is. For example, the removal of the second upper and lower adhesion promoter layers 24a and 24b exposed to the upper and lower openings 28a and 28b may not be necessary, but may be optional.

Figure 16:
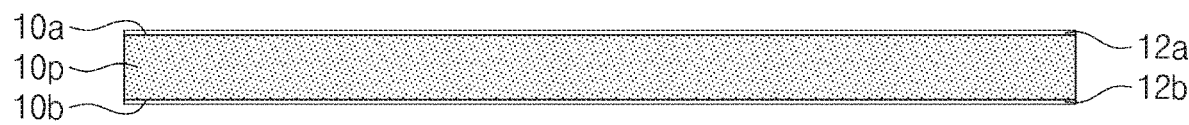
FIG. 16 illustrates a cross-sectional view showing a method of fabricating an alternative example of FIG. 7, according to embodiments of inventive concepts.

FIG. 16 illustrates a cross-sectional view showing a method of fabricating an alternative example of FIG. 7, according to embodiments of inventive concepts.

Referring to FIG. 16, a deposition process such as sputtering may be performed to form the first upper adhesion promoter layer 12a on the top surface 10a of the preliminary substrate body 10p. The preliminary substrate body 10p may be a prepreg in a B-stage state. A deposition process such as sputtering may be performed to form the first lower adhesion promoter layer 12b on the bottom surface 10b of the preliminary substrate body 10p.

Referring back to FIG. 7, an electroless plating process and an electroplating process may be performed to form the first sub-upper conductive layer 14a on the first upper adhesion promoter layer 12a and to from the first sub-lower conductive layer 14b on the first lower adhesion promoter layer 12b. A curing process may be performed to form the substrate body 10.

Figure 17:
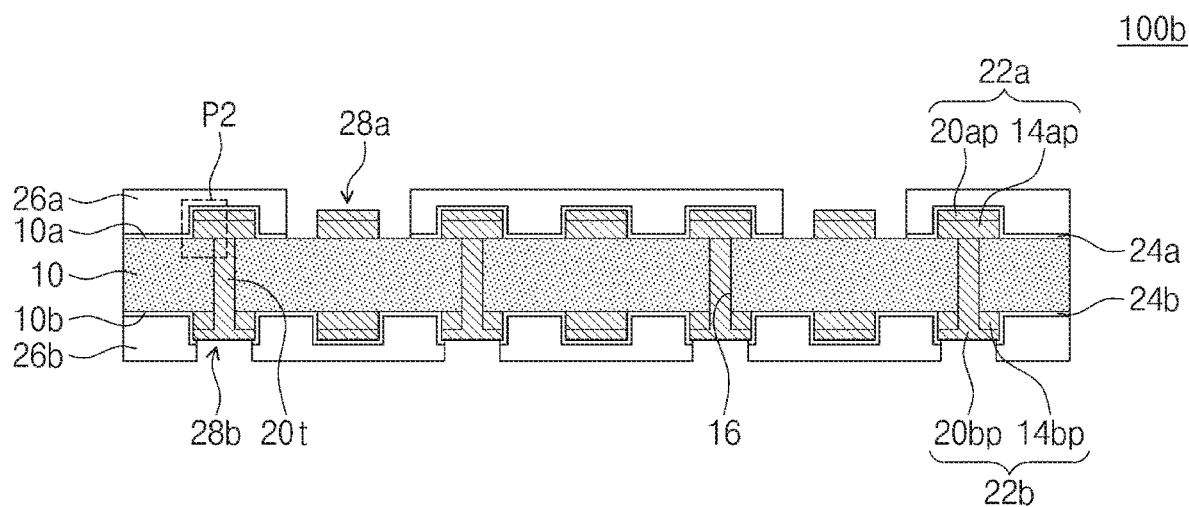
FIG. 17 illustrates a cross-sectional view showing a printed circuit board according to embodiments of inventive concepts.
Figure 18:
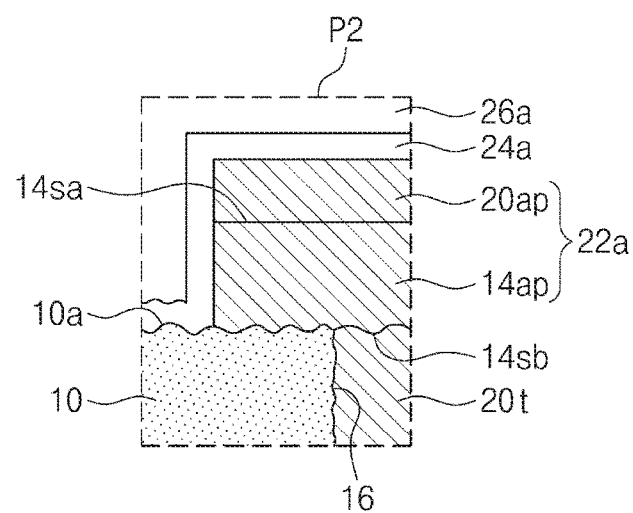
FIG. 18 illustrates an enlarged cross-sectional view showing section P2 of FIG. 17.

FIG. 17 illustrates a cross-sectional view showing a printed circuit board according to embodiments of inventive concepts. FIG. 18 illustrates an enlarged cross-sectional view showing section P2 of FIG. 17.

Referring to FIGS. 17 and 18, unlike the printed circuit board 100 of FIG. 3, a printed circuit board 100b according to the present embodiment may not include the first upper adhesion promoter pattern 12ap, the first lower adhesion promoter pattern 12bp, and the via adhesion promoter pattern 18a. The first sub-upper conductive pattern 14ap may have a bottom surface 14sb whose surface roughness is greater than that of a top surface 14sa of the first sub-upper conductive pattern 14ap. For example, the bottom surface 14sb of the first sub-upper conductive pattern 14ap may have a ten-point mean roughness (Rz) ranging from about 1.5 μm to about 10 μm, and the top surface 14sa of the first sub-upper conductive pattern 14ap may have a ten-point mean roughness (Rz) ranging from about 0 μm to 0.2 μm. The top surface 10a of the substrate body 10 may have a surface roughness identical or similar to that of the bottom surface 14sb of the first sub-upper conductive pattern 14ap. The first sub-lower conductive pattern 14bp may have a top surface whose surface roughness is identical or similar to that of the bottom surface 14sb of the first sub-upper conductive pattern 14ap. The bottom surface 10b of the substrate body 10 may have a surface roughness identical or similar to that of the bottom surface 14sb of the first sub-upper conductive pattern 14ap. Other configurations may be identical or similar to those discussed with reference to FIGS. 3 to 5.

Figure 19:
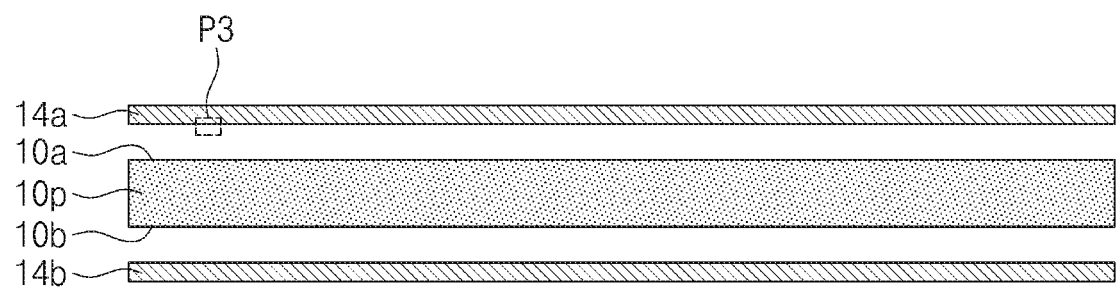
FIGS. 19 and 21 illustrate cross-sectional views showing a method of fabricating a printed circuit board having the cross-section of FIG. 17.
Figure 20:
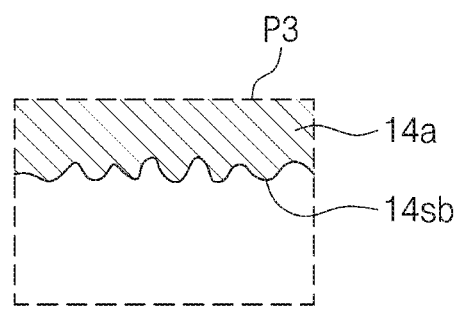
FIG. 20 illustrates an enlarged cross-sectional view showing section P3 of FIG. 19.
Figure 21:
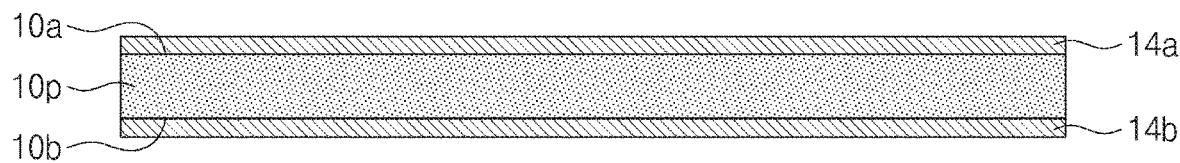

FIGS. 19 and 21 illustrate cross-sectional views showing a method of fabricating a printed circuit board having the cross-section of FIG. 17. FIG. 20 illustrates an enlarged cross-sectional view showing section P3 of FIG. 19.

Referring to FIGS. 19 and 20, there may be provided the first sub-upper conductive layer 14a, the first sub-lower conductive layer 14b, and the preliminary substrate body 10p. Copper may be used to form the first sub-upper conductive layer 14a and the first sub-lower conductive layer 14b. The bottom surface 14sb of the first sub-upper conductive layer 14a and the top surface of the first sub-lower conductive layer 14b may be etched to have their large surface roughness. The surface roughness may be the same as that discussed above.

Referring to FIG. 21, the preliminary substrate body 10p may be heated under elevated pressure, which preliminary substrate body 10p is interposed between the first sub-upper conductive layer 14a and the first sub-lower conductive layer 14b, with the result that the first sub-upper conductive layer 14a and the first sub-lower conductive layer 14b may be attached to the substrate body 10. Because a relatively large surface roughness is formed on the bottom surface 14sb of the first sub-upper conductive layer 14a and the top surface of the first sub-lower conductive layer 14b, such surface roughness may be transferred to the top and bottom surfaces 10a and 10b of the substrate body 10.

Processes the same as those discussed with reference to FIGS. 8 and 11 to 15 may be performed subsequently. In subsequent processes, it may be possible to omit the formation of the first upper adhesion promoter layer 12a, the first lower adhesion promoter layer 12b, and the via adhesion promoter layer 18 that are discussed with reference to FIGS. 6, 9, and 10.

An atomic force microscope (AFM) may be used to measure a surface roughness of each of top and bottom surfaces of the first sub-upper conductive pattern 14ap. The surface roughness of each of the top and bottom surfaces of the first sub-upper conductive pattern 14ap may be measured in a state (i.e., a plate state) shown in FIG. 19 or 21 before other patterns are formed. Alternatively, the surface roughness of each of the top and bottom surfaces of the first sub-upper conductive pattern 14ap may be measured before other patterns are formed as illustrated in FIG. 17. In this case, the surface roughness may be measured for each unit distance. In this description, the unit distance for measuring the surface roughness may fall within a range from about 0.1 µm to about 2 µm.

Figure 22:
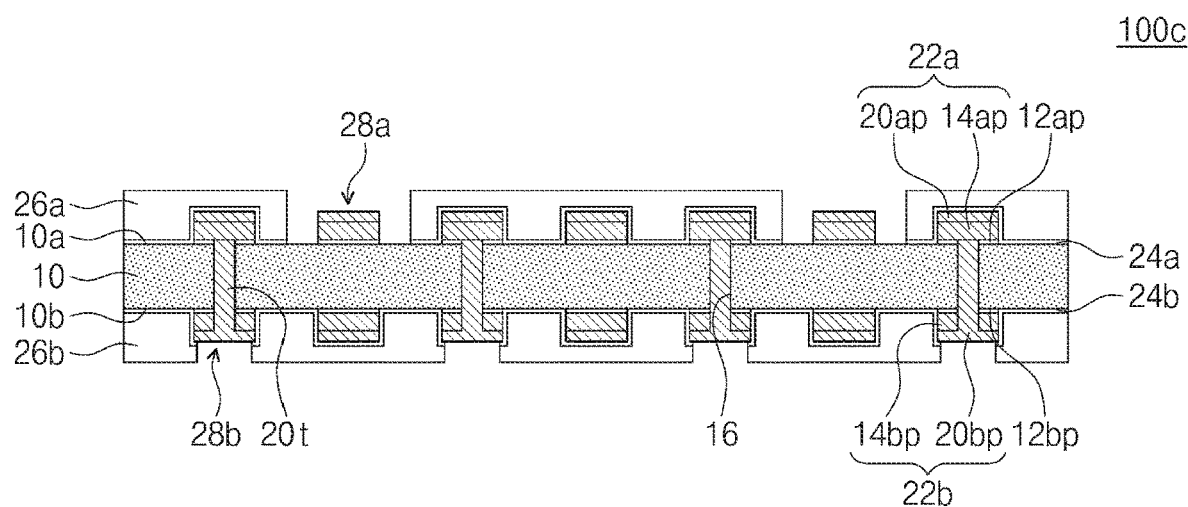
FIG. 22 illustrates a cross-sectional view showing a printed circuit board according to embodiments of inventive concepts.

FIG. 22 illustrates a cross-sectional view showing a printed circuit board according to embodiments of inventive concepts.

Referring to FIG. 22, unlike the printed circuit board 100 of FIG. 3, a printed circuit board 100c according to the present embodiment may not include the via adhesion promoter pattern 18a. Other configurations may be identical or similar to those discussed with reference to FIGS. 3 to 5.

Figure 23:
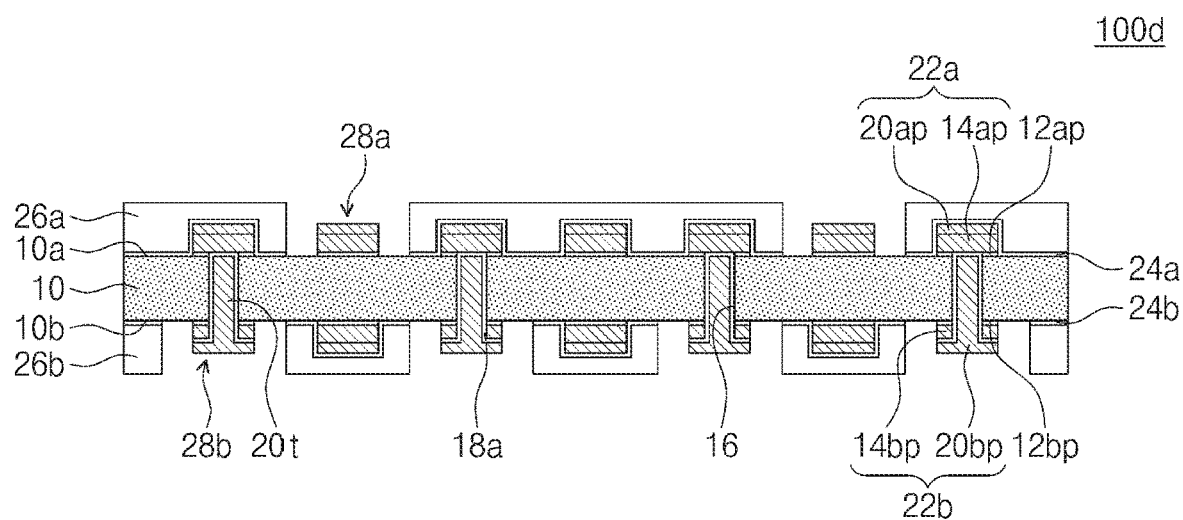
FIG. 23 illustrates a cross-sectional view showing a printed circuit board according to embodiments of inventive concepts.

FIG. 23 illustrates a cross-sectional view showing a printed circuit board according to embodiments of inventive concepts.

Referring to FIG. 23, a printed circuit board 100d according to the present embodiment may include the via adhesion promoter pattern 18a extending to be interposed between the upper conductive pattern 22a and the through via 20t. The via adhesion promoter pattern 18a may further extend to be interposed between the first sub-lower conductive pattern 14bp and the second sub-lower conductive pattern 20bp. In this case, the via adhesion promoter pattern 18a may have a thickness ranging from about 0.1 nm to about 1 nm. When the via adhesion promoter pattern 18a has such small thickness, the through via 20t and the upper conductive pattern 22a may be electrically connected to each other. The printed circuit board 100d may be fabricated without performing the anisotropic etching process, which is discussed in FIG. 10, on the via adhesion promoter layer 18 of FIG. 9.

Figure 24:
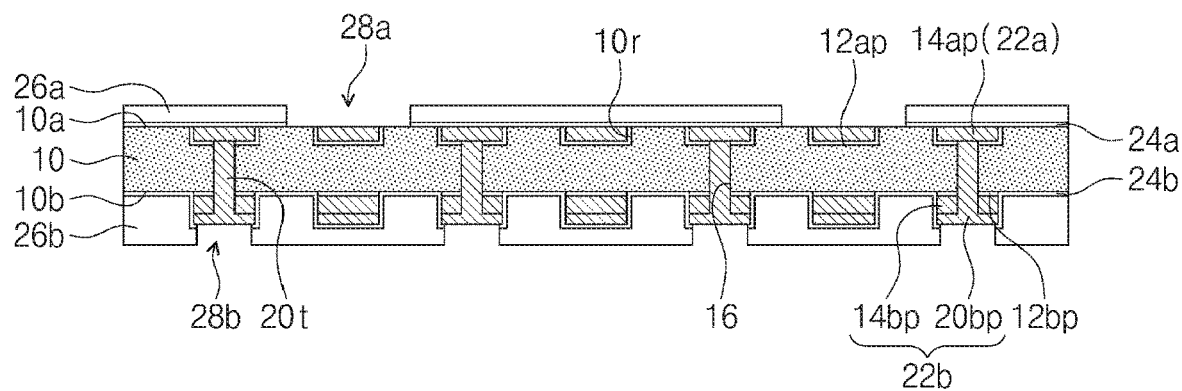
FIG. 24 illustrates a cross-sectional view showing a printed circuit board according to embodiments of inventive concepts.

FIG. 24 illustrates a cross-sectional view showing a printed circuit board according to embodiments of inventive concepts.

Referring to FIG. 24, a printed circuit board 100e according to the present embodiment may include a recession 10r on the top surface 10a of the substrate body 10. The upper conductive pattern 22a may be disposed in the recession 10r. The upper conductive pattern 22a may include only the first sub-upper conductive pattern 14ap. The first upper adhesion promoter pattern 12ap may be interposed between the substrate body 10 and a sidewall of the upper conductive pattern 22a and between the substrate body 10 and a bottom surface of the upper conductive pattern 22a. The upper conductive pattern 22a may have a top surface at a level the same as or lower than that of the top surface 10a of the substrate body 10. Other configurations may be identical or similar to those discussed with reference to FIG. 22.

FIGS. 25, 26, 27, 28, 29, 30 and 31 illustrate cross-sectional views showing a method of fabricating a printed circuit board having the cross-section of FIG. 24.

Figure 25:
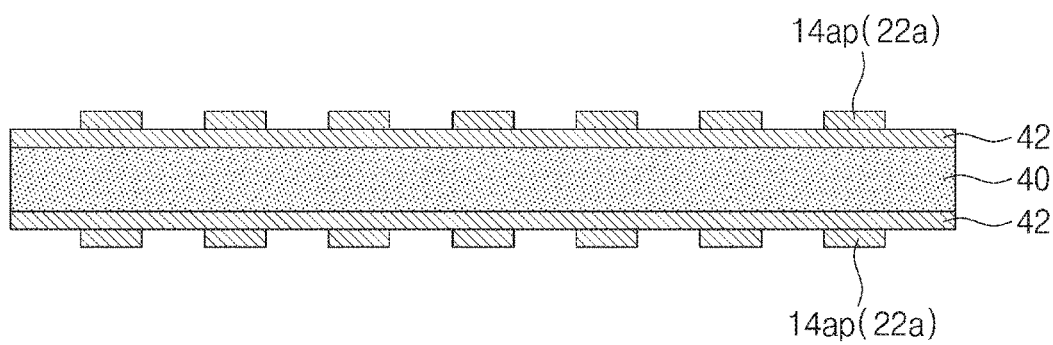
FIGS. 25, 26, 27, 28, 29, 30 and 31 illustrate cross-sectional views showing a method of fabricating a printed circuit board shown in FIG. 24.

Referring to FIG. 25, a sacrificial carrier 40 may be prepared. Sacrificial layers 42 may be formed on top and bottom surfaces of the sacrificial carrier 40. The sacrificial carrier 40 may be, for example, a prepreg. The sacrificial layer 42 may be formed of, for example, copper. A release layer may be interposed between the sacrificial carrier 40 and the sacrificial layers 42. The release layer may be formed of a ceramic layer or a polymer layer. The upper conductive layer 22a may be formed on the sacrificial layer 42 provided on each of the top and bottom surfaces of the sacrificial carrier 40. The upper conductive pattern 22a may be formed by a copper damascene process. Alternatively, the upper conductive pattern 22a may be formed by plating and etching processes.

Figure 26:
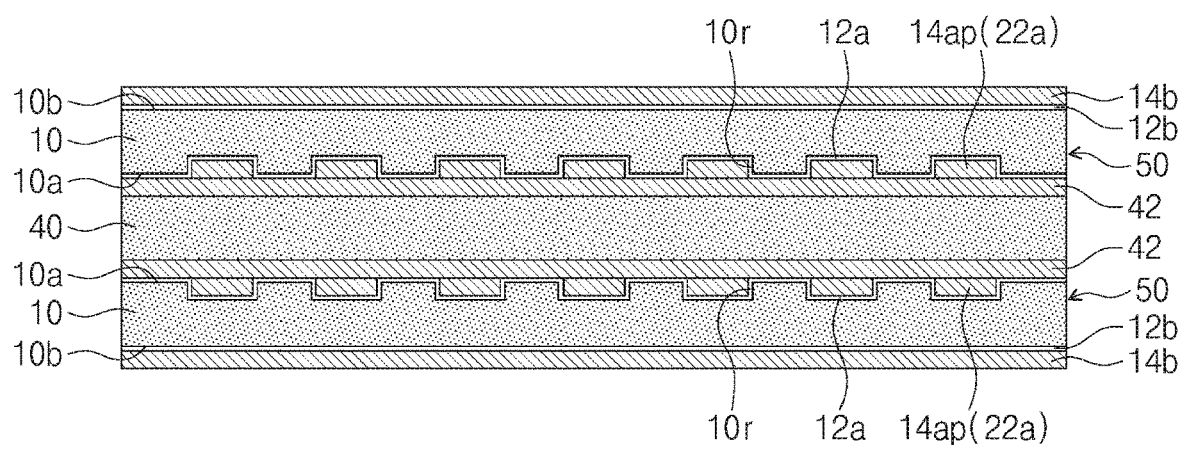

Referring to FIG. 26, on each of the top and bottom surfaces of the sacrificial carrier 40, the first upper adhesion promoter layer 12a may be conformally formed on the sacrificial layer 42 on which the upper conductive pattern 22a is formed. The first upper adhesion promoter layer 12a may be placed thereon with the preliminary substrate body 10p of FIG. 6 and with the first sub-lower conductive layer 14b on which the first lower adhesion promoter layer 12b is formed, following which heat is provided under elevated pressure. The substrate body 10 may then be formed. The substrate body 10 may be partially pressed down by the upper conductive patterns 22a previously formed as discussed with reference to FIG. 25, and thus the recession 10r may be formed on the substrate body 10. The first upper adhesion promoter layer 12a may lie inside the recession 10r. Preliminary substrate structures 50 each including the substrate body 10 may be symmetrically formed on the top and bottom surfaces of the sacrificial carrier 40.

Figure 27:
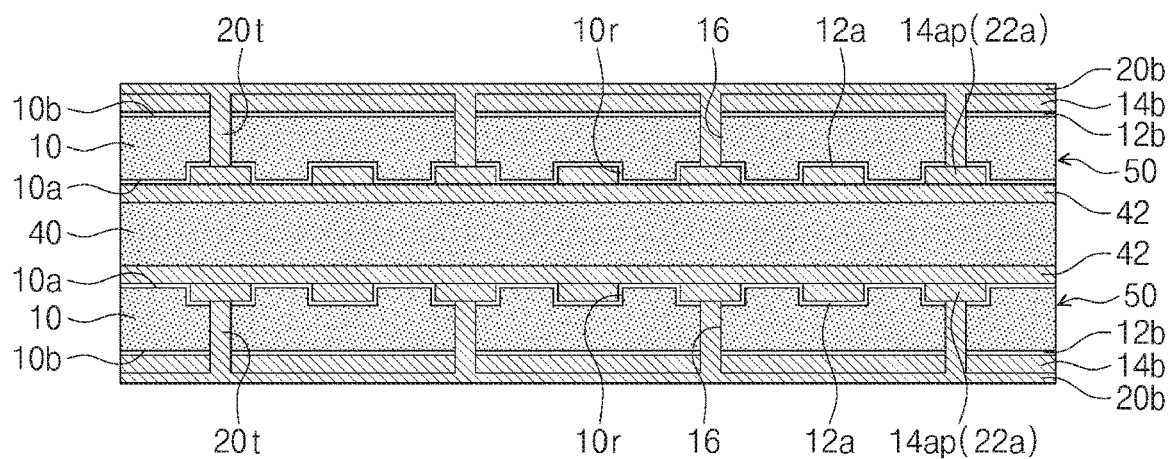

Referring to FIG. 27, similarly to the mentioned with reference to FIG. 8, a laser drilling process may be performed to successively remove the first sub-lower conductive layer 14b, the first lower adhesion promoter layer 12b, the substrate body 10, and the first upper adhesion promoter layer 12a, thereby forming the through hole 16 that exposes the bottom surface of the first sub-upper conductive layer 14a. An electroless plating process and an electroplating process may be performed to form, in the through hole 16, the through via 20t and the second sub-lower conductive layer 20b connected thereto.

Figure 28:
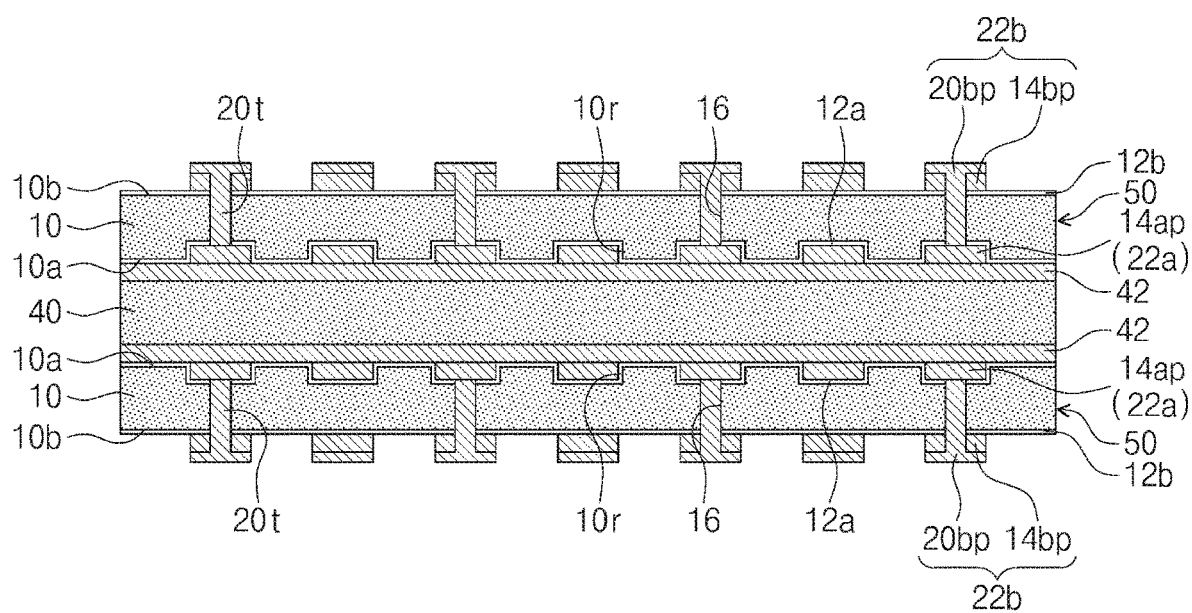

Referring to FIG. 28, the second sub-lower conductive layer 20b and the first sub-lower conductive layer 14b may be sequentially etched to expose the first lower adhesion promoter layer 12b. The lower conductive patterns 22b may be formed. Each of the lower conductive patterns 22b may include a first sub-lower conductive pattern 14bp and a second sub-lower conductive pattern 20bp that are sequentially stacked.

Figure 29:
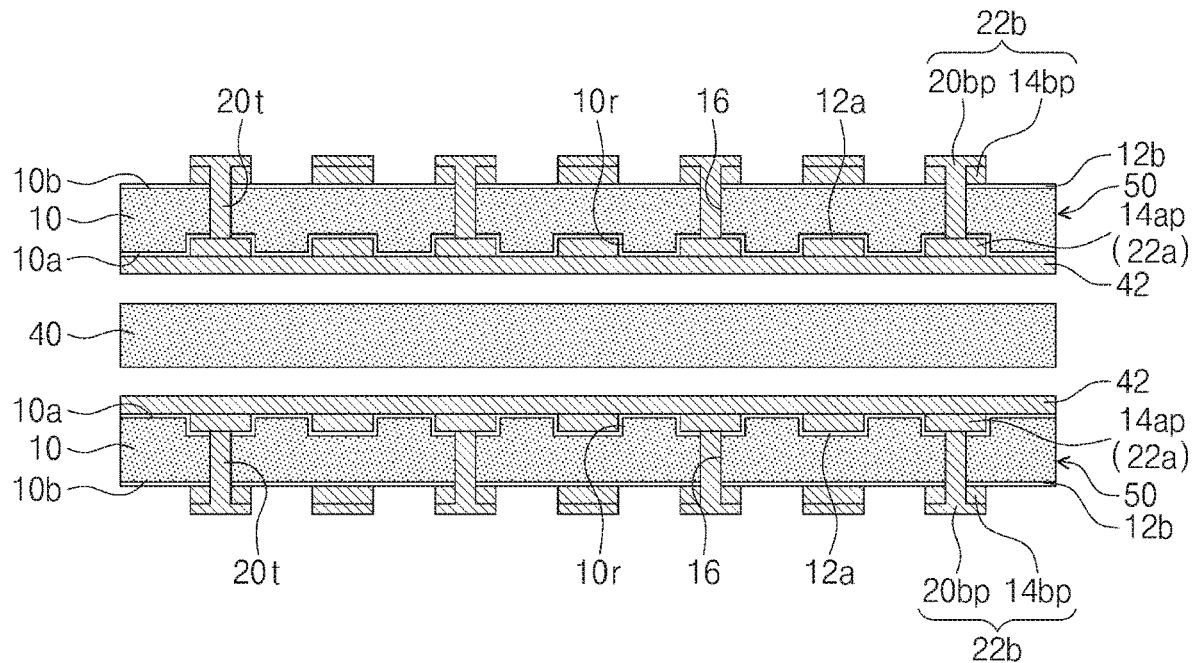

Referring to FIG. 29, the sacrificial carrier 40 may be separated from the sacrificial layer 42. The sacrificial carrier 40 may be easily separated without damaging to the preliminary substrate structure 50 because the release layer is interposed between the sacrificial carrier 40 and the sacrificial layer 42.

Figure 30:
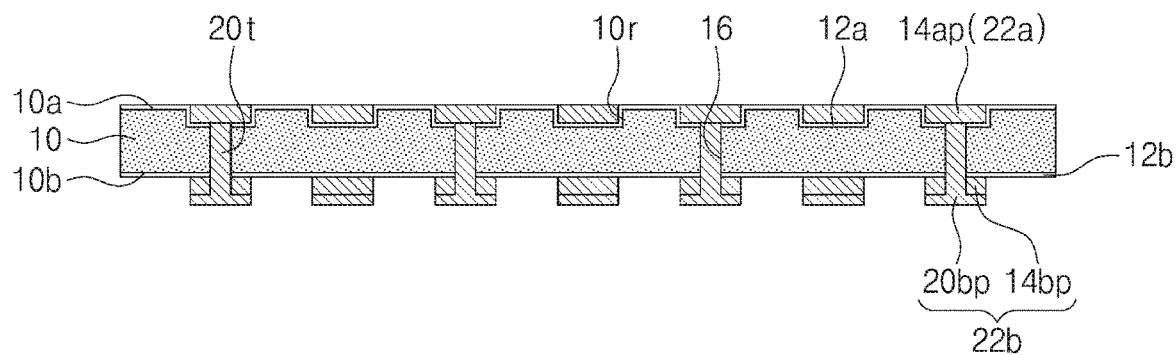

Referring to FIG. 30, the sacrificial layer 42 may be removed from the preliminary substrate structure 50, which step may partially expose the first upper adhesion promoter layer 12a and also expose a top surface of the upper conductive pattern 22a. The removal of the sacrificial layer 42 may be achieved by performing an etching process or a chemical mechanical polishing (CMP) process. The first upper adhesion promoter layer 12a may serve as an etch stop layer or a CMP stop layer. When the first upper adhesion promoter layer 12a is over-etched, the upper conductive pattern 22a may also be partially removed such that the top surface of the upper conductive pattern 22a may become lower than the top surface 10a of the substrate body 10.

Figure 31:
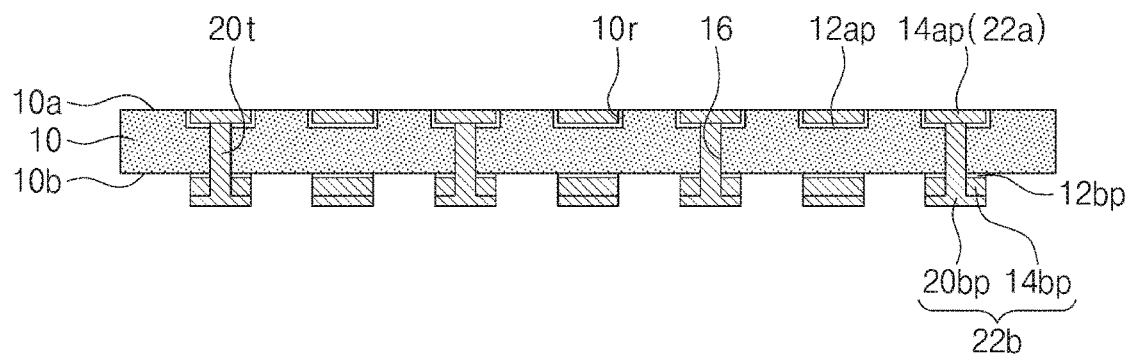

Referring to FIG. 31, the first upper adhesion promoter layer 12a may be removed from the top surface 10a of the substrate body 10, which removal may expose the top surface 10a of the substrate body 10 and may form the first upper adhesion promoter pattern 12ap. The first lower adhesion promoter layer 12b may be removed from the bottom surface 10b of the substrate body 10, which removal may expose the bottom surface 10b of the substrate body 10 and may form the first lower adhesion promoter pattern 12bp.

Subsequently, referring to FIG. 24, the second upper adhesion promoter layer 24a, the upper passivation layer 26a, the upper opening 28a, the second lower adhesion promoter layer 24b, the lower passivation layer 26b, and the lower opening 28b may be formed subsequently as discussed with reference to FIGS. 13 to 15.

Figure 32:
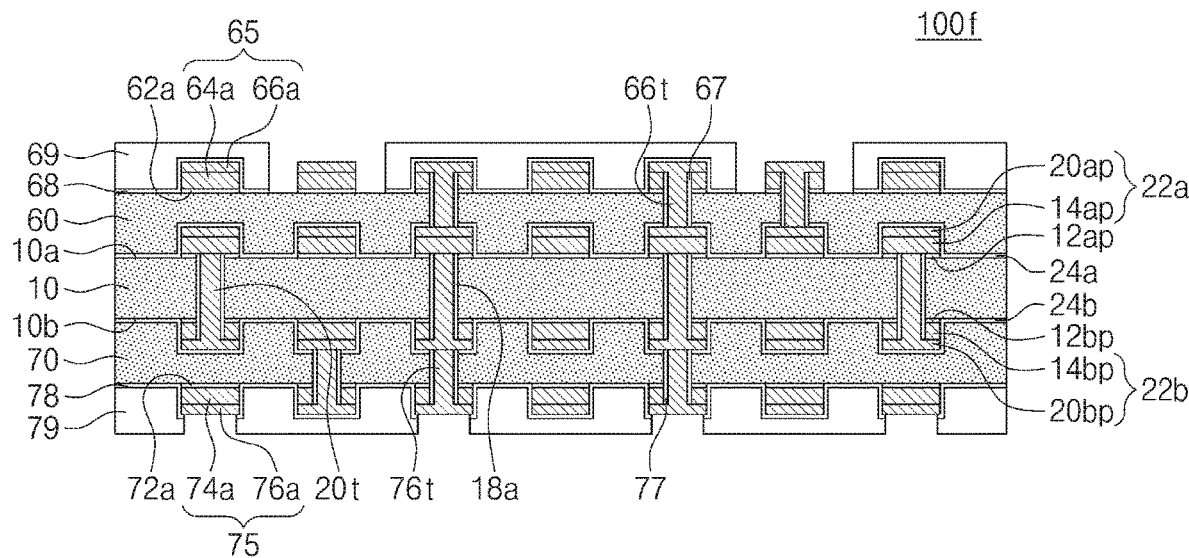
FIG. 32 illustrates a cross-sectional view showing a printed circuit board according to embodiments of inventive concepts.

FIG. 32 illustrates a cross-sectional view showing a printed circuit board according to embodiments of inventive concepts.

Referring to FIG. 32, a printed circuit board 100f according to the present embodiment may have a four-layered wiring structure in which three substrate bodies 70, 10, and 60 are stacked. For example, an upper substrate body 60 may be disposed above an intermediate substrate body 10, and a lower substrate body 70 may be disposed below the intermediate substrate body 10. First upper conductive patterns 22a may be disposed between the intermediate substrate body 10 and the upper substrate body 60. Second upper conductive patterns 65 may be disposed on the upper substrate body 60. An upper passivation layer 69 may cover the second upper conductive patterns 65 and a top surface of the upper substrate body 60. First lower conductive patterns 22b may be disposed between the intermediate substrate body 10 and the lower substrate body 70. Second lower conductive patterns 75 may be disposed on a bottom surface of the lower substrate body 70. A lower passivation layer 79 may cover the second lower conductive patterns 75 and the bottom surface of the lower substrate body 70. The substrate bodies 10, 60, and 70 may all be formed of an epoxy-containing layer, for example, a prepreg. The passivation layers 69 and 79 may all be formed of an epoxy-containing layer, for example, a photosensitive solder resist layer.

Ones of the first upper conductive patterns 22a may be electrically connected through intermediate through vias 20t to ones of the first lower conductive patterns 22b. Others of the first upper conductive patterns 22a may be electrically connected through upper through vias 66t to ones of the second upper conductive patterns 65. Others of the first lower conductive patterns 22b may be electrically connected through lower through vias 76t to ones of the second lower conductive patterns 75. Copper may be used to form the first and second upper conductive patterns 22a and 65, the first and second lower conductive patterns 22b and 75, and the through vias 20t, 66t, and 76t. Each of the first upper conductive patterns 22a may include a first sub-upper conductive pattern 14ap and a second sub-upper conductive pattern 20ap that are sequentially stacked. Each of the second upper conductive patterns 65 may include a third sub-upper conductive pattern 64a and a fourth sub-upper conductive pattern 66a that are sequentially stacked. Each of the lower conductive patterns 22b may include a first sub-lower conductive pattern 14bp and a second sub-lower conductive pattern 20bp. Each of the second lower conductive patterns 75 may include a third sub-lower conductive pattern 74a and a fourth sub-lower conductive pattern 76a.

A first upper adhesion promoter pattern 12ap may be interposed between the first upper conductive pattern 22a and the intermediate substrate body 10. A second upper adhesion promoter layer 24a may be interposed between the first upper conductive pattern 22a and the upper substrate body 60. The second upper adhesion promoter layer 24a may extend to be interposed between the upper substrate body 60 and the intermediate substrate body 10. A third upper adhesion promoter pattern 62a may be interposed between the second upper conductive pattern 65 and the upper substrate body 60. A fourth upper adhesion promoter layer 68 may be interposed between the second upper conductive pattern 65 and the upper passivation layer 69.

A first lower adhesion promoter pattern 12bp may be interposed between the first lower conductive pattern 22b and the intermediate substrate body 10. A second lower adhesion promoter layer 24b (i.e., a second adhesion promoter layer) may be interposed between the first lower conductive pattern 22b and the lower substrate body 70. The second lower adhesion promoter layer 24b may extend to be interposed between the lower substrate body 70 and the intermediate substrate body 10. A third lower adhesion promoter pattern 72a may be interposed between the second lower conductive pattern 75 and the lower substrate body 70. A fourth lower adhesion promoter layer 78 may be interposed between the second lower conductive pattern 75 and the lower passivation layer 79.

An intermediate via adhesion promoter pattern 18a may be interposed between the intermediate through via 20t and the intermediate substrate body 10. An upper via adhesion promoter pattern 67 may be interposed between the upper through via 66t and the upper substrate body 60. A lower via adhesion promoter pattern 77 may be interposed between the lower through via 76t and the lower substrate body 70. The adhesion promoter patterns/layers 12ap, 12bp, 24a, 24b, 62a, 68, 72a, 78, 18a, 67, and 77 may all include an aluminum oxide layer. Other configurations may be identical or similar to those discussed with reference to FIGS. 3 to 5.

Figure 33:
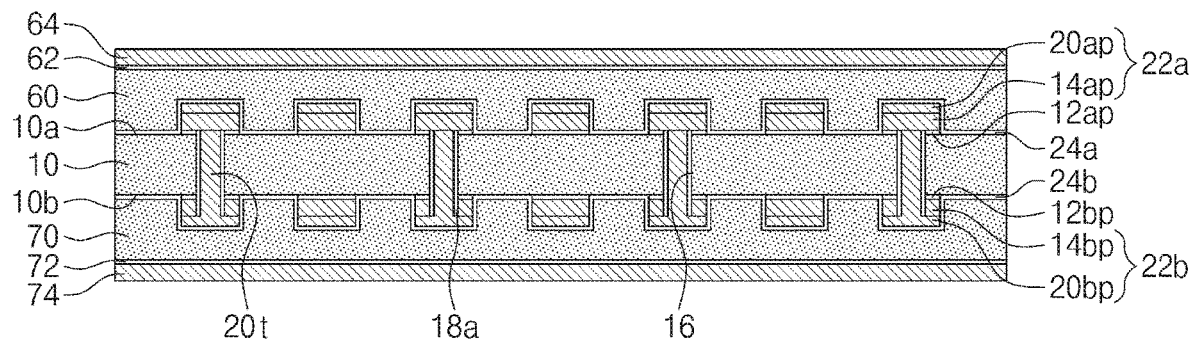
FIGS. 33 and 34 illustrate cross-sectional views showing a method of fabricating a printed circuit board shown in FIG. 32.
Figure 34:
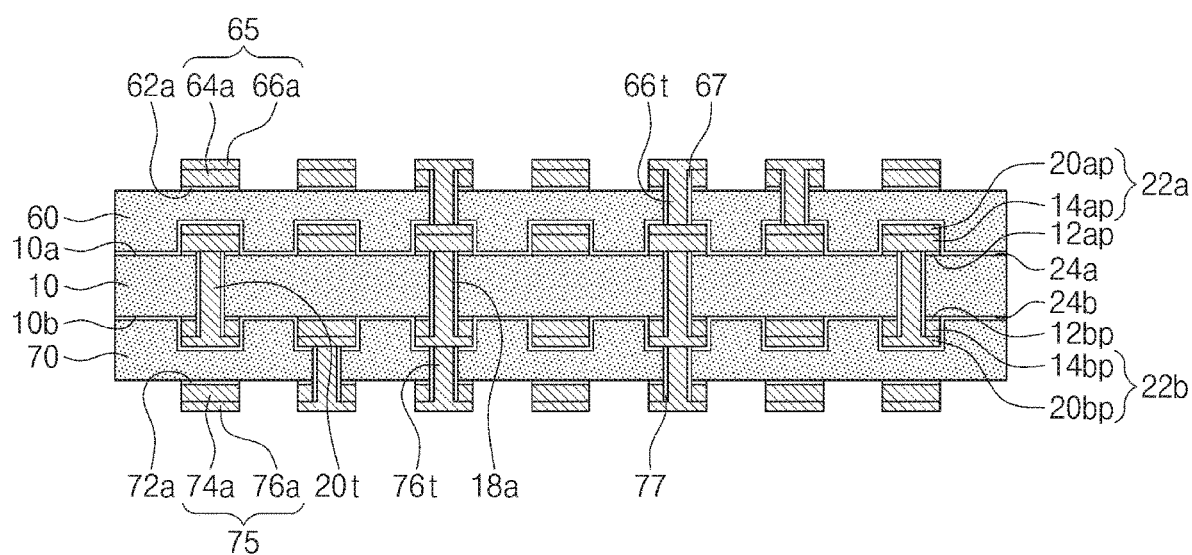

FIGS. 33 and 34 illustrate cross-sectional views showing a method of fabricating a printed circuit board of FIG. 32.

Referring to FIG. 33, in a state shown in FIG. 13, a top surface 10a of an intermediate substrate body 10 may be placed thereon with an upper substrate body 60 and with a second upper conductive layer 64 on which a third upper adhesion promoter layer 62 is formed. A bottom surface 10b of the intermediate substrate body 10 may be placed thereon with a lower substrate body 70 and with a second lower conductive layer 74 on which a third lower adhesion promoter layer 72 is formed. The substrate bodies 10, 60, and 70 may be heated under elevated pressure and thereby adhered to each other.

Referring to FIG. 34, through vias 66t and 76t, via adhesion promoter patterns 67 and 77, second upper conductive patterns 65, and second lower conductive patterns 75 may be formed identically or similarly to the mentioned with reference to FIGS. 8 to 12.

In subsequent, referring to FIG. 32, a fourth upper adhesion promoter layer 68, an upper passivation layer 69, a fourth lower adhesion promoter layer 78, and a lower passivation layer 79 may be formed identically or similarly to the mentioned with reference to FIGS. 13 to 15.

The following describes application examples of the printed circuit board discussed above. The printed circuit board may be used as a package substrate of a semiconductor package or as a module substrate or a board of a semiconductor module.

Figure 35A:
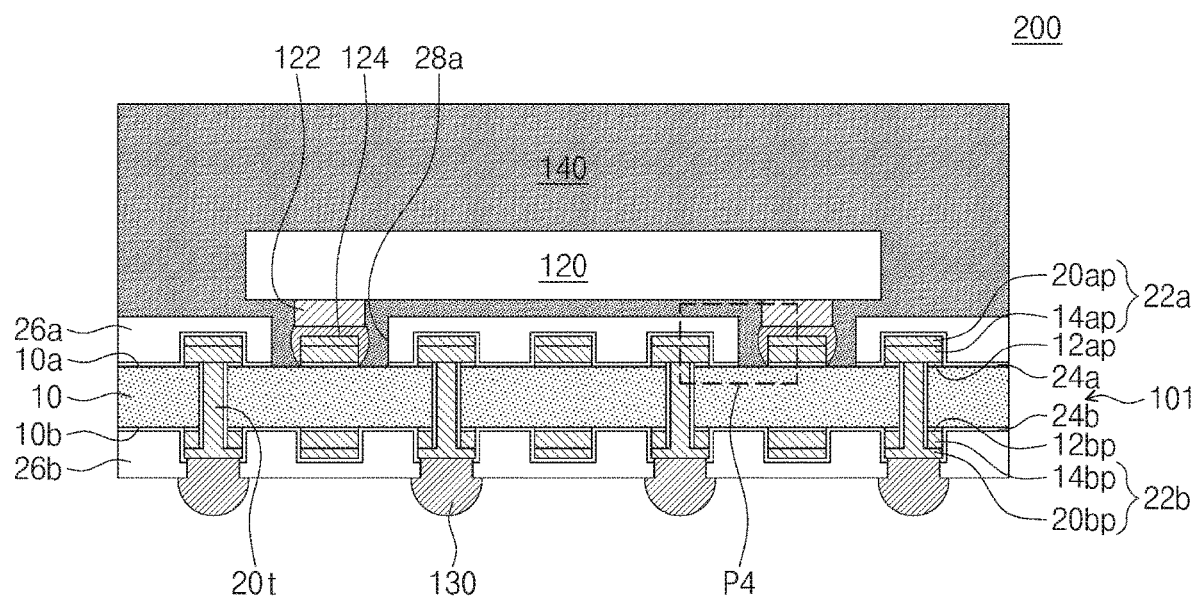
FIG. 35A illustrates a cross-sectional view showing a semiconductor package according to embodiments of inventive concepts.
Figure 35B:
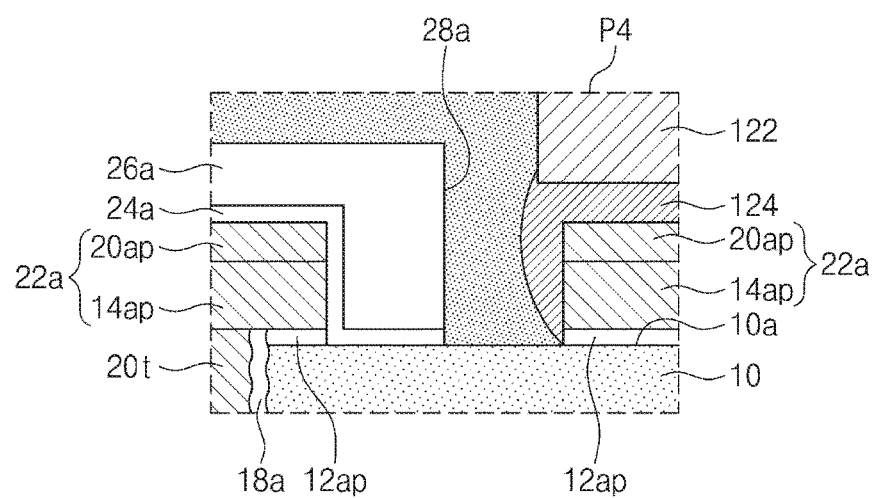
FIGS. 35B and 35C illustrate enlarged cross-sectional views showing section P4 of FIG. 35A.
Figure 35C:
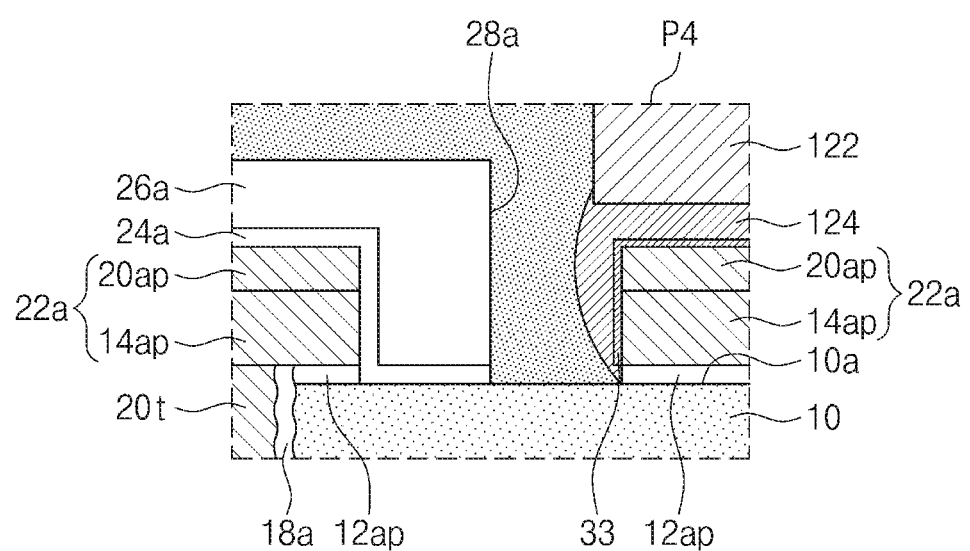

FIG. 35A illustrates a cross-sectional view showing a semiconductor package according to embodiments of inventive concepts. FIGS. 35B and 35C illustrate enlarged cross-sectional views showing section P4 of FIG. 35A.

Referring to FIGS. 35A to 35C, a semiconductor package 200 may be configured in such a way that a semiconductor chip 120 is mounted on a package substrate 101 in a flip-chip bonding manner. The package substrate 101 is exemplarily illustrated to have the same structure as that of the printed circuit board 100 of FIG. 3, but may have the same structure as that of any one or a combination of the printed circuit boards 100b to 100f discussed above. The semiconductor chip 120 may be a logic chip, a memory chip, or a combination thereof. The semiconductor chip 120 may be provided with a conductive bump 122 disposed on a bottom surface thereof. For example, the conductive bump 122 may include at least one out of gold, copper, aluminum, and tin. The conductive bump 122 may be positioned on one of the upper conductive patterns 22a that is exposed to the upper opening 28a. A solder layer 124 may be interposed between the conductive bump 122 and the upper conductive pattern 22a. The solder layer 124 may include tin or lead. The solder layer 124 may extend to cover a sidewall of the upper conductive pattern 22a. The semiconductor chip 120 and the package substrate 101 may be covered with a mold layer 140. The mold layer 140 may include an epoxy-containing layer. The mold layer 140 may extend to and fill a space between the upper passivation layer 26a and the semiconductor chip 120. The mold layer 140 may extend into the upper opening 28a and may thus be in contact with a sidewall of the upper passivation layer 26a, a sidewall of the second upper adhesion promoter layer 24a, and the top surface 10a of the substrate body 10. Ones of the lower conductive patterns 22b may be attached thereon with external terminals 130 such as solder balls. As illustrated in FIG. 35C, an anti-oxidation layer 33 may cover top and side surfaces of the upper conductive pattern 22a exposed to the upper opening 28a. For example, the anti-oxidation layer 33 may be interposed between the upper conductive pattern 22a and the solder layer 124. The anti-oxidation layer 33 may include at least one out of gold, nickel, palladium, silver, and tin. The anti-oxidation layer 33 may be formed by, for example, a plating process. The anti-oxidation layer 33 may prevent oxidation of the top and side surfaces of the upper conductive pattern 22a exposed to the upper opening 28a.

The fabrication of the semiconductor package 200 may be as follows. The solder layer 124 may be interposed to bond the semiconductor chip 120 onto the package substrate 101 identical to the printed circuit board 100 of FIG. 3, and thereafter the mold layer 140 may be formed. The external terminals 130 may be bonded onto the lower conductive patterns 22b.

Figure 36A:
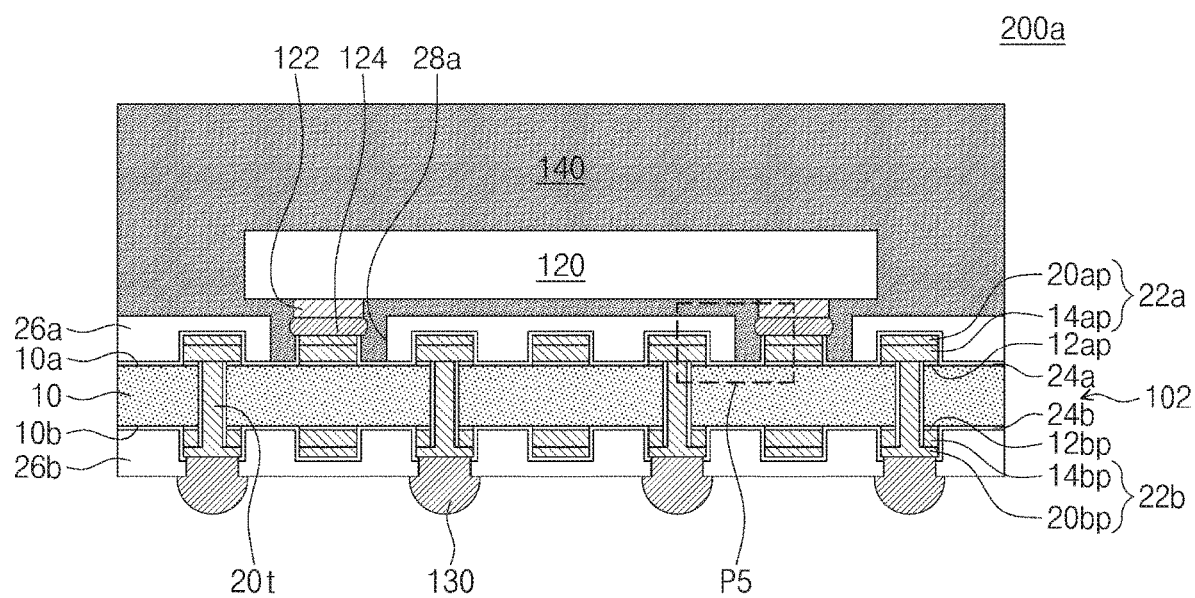
FIG. 36A illustrates a cross-sectional view showing a semiconductor package according to embodiments of inventive concepts.
Figure 36B:
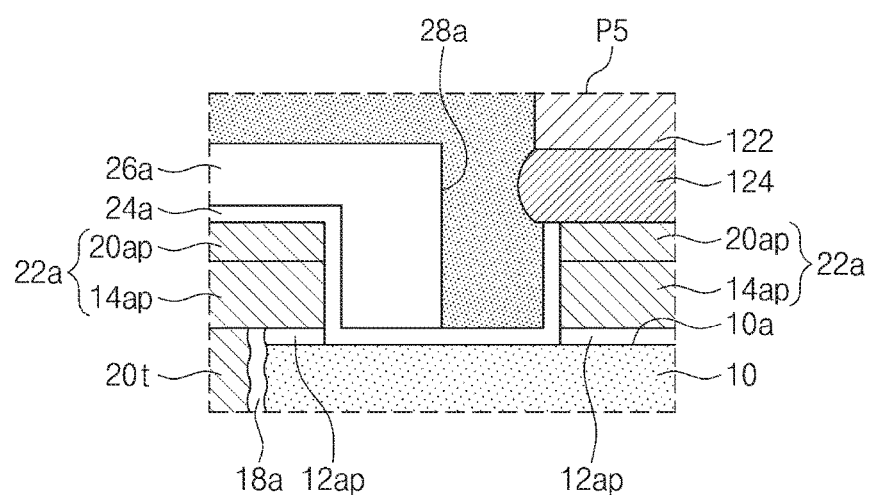
FIG. 36B illustrates an enlarged cross-sectional view showing section P5 of FIG. 35A.

FIG. 36A illustrates a cross-sectional view showing a semiconductor package according to embodiments of inventive concepts. FIG. 36B illustrates an enlarged cross-sectional view showing section P5 of FIG. 35A.

Referring to FIGS. 36A and 36B, a semiconductor package 200a may be configured in such a way that a semiconductor chip 120 is mounted on a package substrate 102 in a flip-chip bonding manner. For example, the package substrate 102 may have the same structure as that of the printed circuit board 100a of FIG. 15. The package substrate 102 may be configured in such a way that the upper opening 28a exposes the second upper adhesion promoter layer 24a. For example, within the upper opening 28a, the second upper adhesion promoter layer 24a may extend to cover the sidewall of the upper conductive pattern 22a and the top surface 10a of the substrate body 10. A solder layer 124 may be interposed between the upper conductive pattern 22a and the conductive bump 122, but may not extend onto the sidewall of the upper conductive pattern 22a. A mold layer 140 may be in contact with the second upper adhesion promoter layer 24a within the upper opening 28a. Within the upper opening 28a, the second upper adhesion promoter layer 24a may be interposed between the upper conductive pattern 22a and the mold layer 140, thereby increasing an adhesive force between the upper conductive pattern 22a and the mold layer 140. Other configurations may be identical or similar to those discussed with reference to FIGS. 35A and 35B.

The fabrication of the semiconductor package 200a may be as follows. First, there may be prepared the package substrate 102 identical to the printed circuit board 100a of FIG. 15. The semiconductor chip 120 may be prepared to include a solder ball attached thereto, and then a flux agent may be introduced onto a bottom surface of the solder ball. The solder ball may be inserted into the upper opening 28a and then heated, with the result that the flux agent may remove the second upper adhesion promoter layer 24a on the upper conductive pattern 22a, and that the solder ball may be melted to form the solder layer 124 in contact with a top surface of the upper conductive pattern 22a. After that, the mold layer 140 may be formed.

Figure 37A:
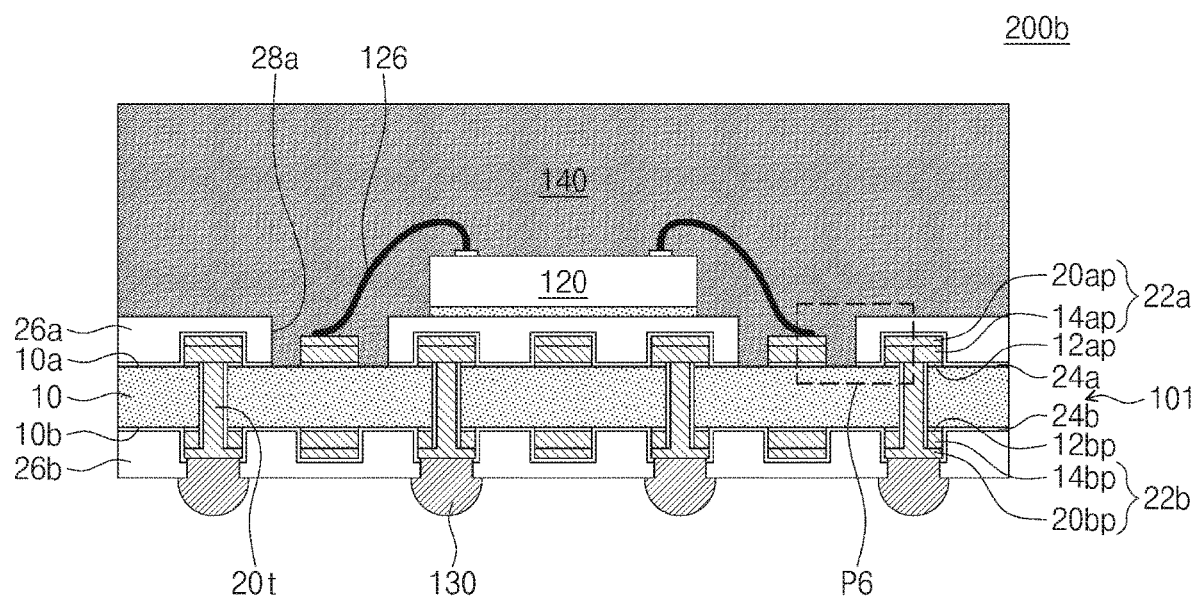
FIG. 37A illustrates a cross-sectional view showing a semiconductor package according to embodiments of inventive concepts.
Figure 37B:
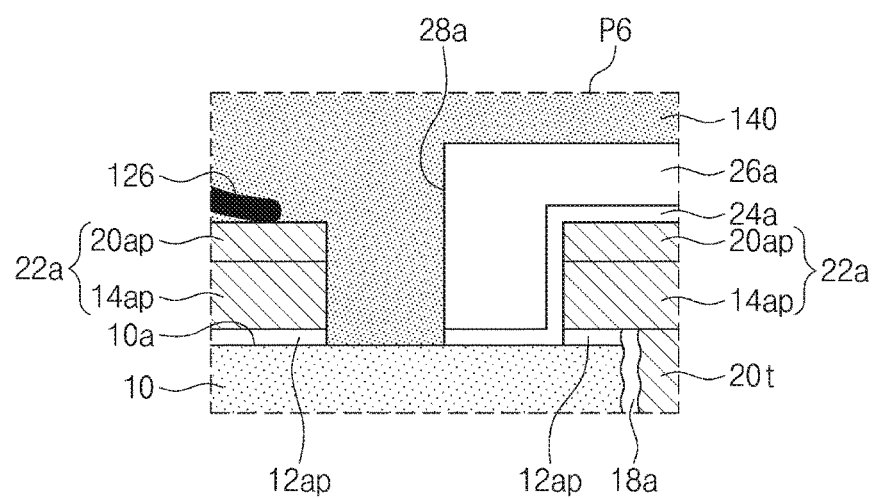
FIGS. 37B and 37C illustrate enlarged cross-sectional views showing section P6 of FIG. 37A.
Figure 37C:
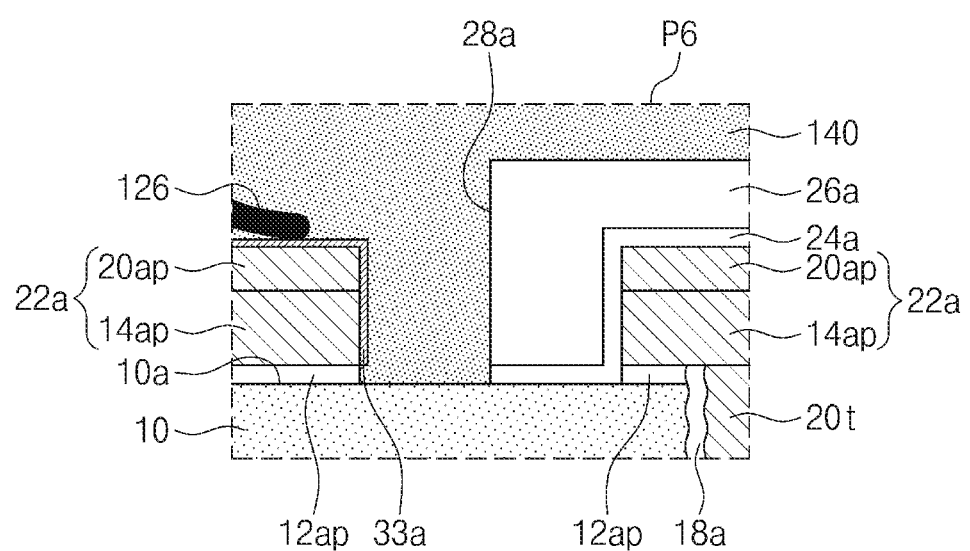

FIG. 37A illustrates a cross-sectional view showing a semiconductor package according to embodiments of inventive concepts. FIGS. 37B and 37C illustrate enlarged cross-sectional views showing section P6 of FIG. 37A.

Referring to FIGS. 37A to 37C, a semiconductor package 200b may be configured in such a way that a wire 126 is used to mount a semiconductor chip 120 on a package substrate 101 in a wire bonding manner. The package substrate 101 is exemplarily illustrated to have the same structure as that of the printed circuit board 100 of FIG. 3, but may have the same structure as that of any one or a combination of the printed circuit boards 100b to 100f discussed above. The wire 126 may be in direct contact with the upper conductive pattern 22a exposed in the upper opening 28a. As illustrated in FIG. 37C, an anti-oxidation layer 33a may cover top and side surfaces of the upper conductive pattern 22a exposed to the upper opening 28a. The anti-oxidation layer 33a may thus be in contact with the wire 126. The anti-oxidation layer 33a may include gold or nickel. The anti-oxidation layer 33a may be formed by, for example, a plating process. The anti-oxidation layer 33a may prevent oxidation of the top and side surfaces of the upper conductive pattern 22a exposed to the upper opening 28a.

Figure 38A:
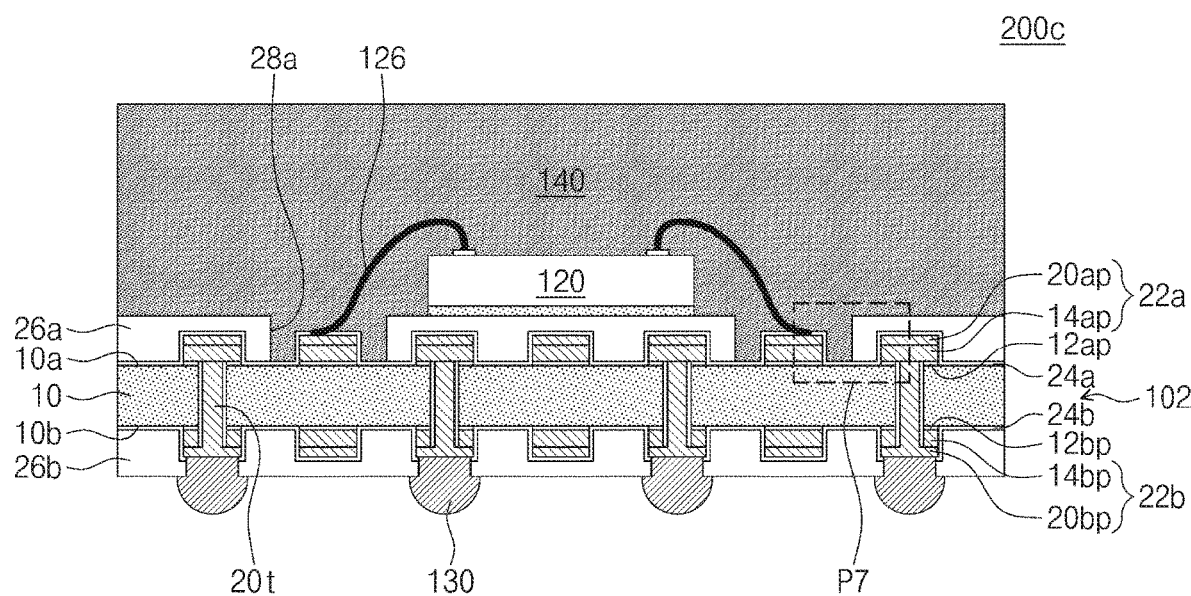
FIG. 38A illustrates a cross-sectional view showing a semiconductor package according to embodiments of inventive concepts.
Figure 38B:
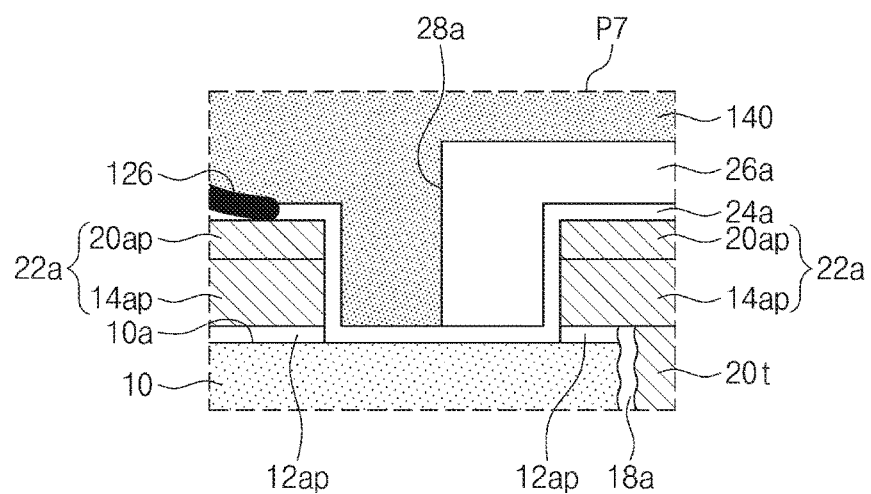
FIG. 38B illustrates an enlarged cross-sectional view showing section P7 of FIG. 38A.

FIG. 38A illustrates a cross-sectional view showing a semiconductor package according to embodiments of inventive concepts. FIG. 38B illustrates an enlarged cross-sectional view showing section P7 of FIG. 38A.

Referring to FIGS. 38A and 38B, a semiconductor package 200c may be configured in such a way that a wire 126 is used to mount a semiconductor chip 120 on a package substrate 102 in a wire bonding manner. For example, the package substrate 102 may have the same structure as that of the printed circuit board 100a of FIG. 15. Within the upper opening 28a, the wire 126 may penetrate the second upper adhesion promoter layer 24a and may be in contact with the upper conductive pattern 22a. The second upper adhesion promoter layer 24a may have a thickness ranging, for example, from about 0.1 nm to about 10 nm. Other configurations may be identical or similar to those discussed with reference to FIGS. 36A and 36B.

The fabrication of the semiconductor package 200c may be as follows. First, there may be prepared the package substrate 102 identical to the printed circuit board 100a of FIG. 15. The semiconductor chip 120 may be attached onto the package substrate 102. The upper conductive pattern 22a and a terminal of the semiconductor chip 120 may be connected through the wire 126. The wire 126 may be formed by using a capillary into which the wire 126 is inserted. When the capillary is pressed down against a top surface of the upper conductive pattern 22a, the wire 126 may be attached onto and cut off from the upper conductive pattern 22a. If the second upper adhesion promoter layer 24a has a thickness ranging from about 0.1 nm to about 10 nm, the second upper adhesion promoter layer 24a may be partially removed when the capillary is pressed down against the upper conductive pattern 22a. The mold layer 140 may be formed subsequently.

Figure 39:
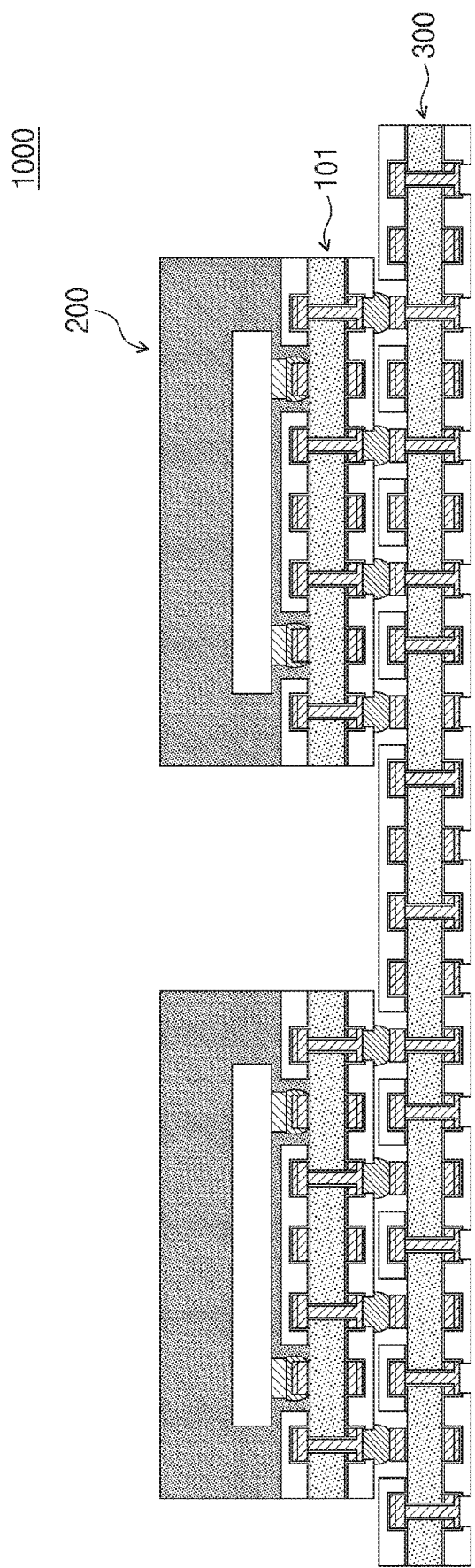
FIG. 39 illustrates a cross-sectional view showing a semiconductor module according to embodiments of inventive concepts.

FIG. 39 illustrates a cross-sectional view showing a semiconductor module according to embodiments of inventive concepts.

Referring to FIG. 39, a semiconductor module 1000 may be configured in such a way that the printed circuit board of inventive concepts is used as a package substrate 101 and a board 300 (or a module substrate). The board 300 may be mounted thereon with, for example, the semiconductor package 200 of FIG. 35A. The package substrate 101 and the board 300 may have the same structure as that of any one or a combination of the printed circuit boards 100 to 100f discussed above.

According to embodiments of inventive concepts, a printed circuit board and a semiconductor package including the same may be configured such that a copper pattern and an epoxy-containing layer are provided therebetween with an adhesion promoter layer by which an adhesive force is increased between the copper pattern and the epoxy-containing layer. This configuration may solve a delamination problem between the copper pattern and the epoxy-containing layer. As a result, the printed circuit board and the semiconductor package may increase in reliability.

Furthermore, the adhesion promoter layer results in the copper pattern being not required to be treated to have a large surface roughness, which may increase a signal transmission speed and prevent collapse of the copper pattern.

While the inventive concept has been shown and described with reference to embodiments thereof, it will be understood that various changes in form and details may be made therein without departing from the spirit and scope of the following claims.

What is claimed is:

1. A printed circuit board comprising:
an epoxy-containing member comprising a first substrate body and a passivation layer covering the first substrate body;
a first copper pattern disposed on the first substrate body, and having a top surface on which the passivation layer is disposed; and
a first adhesion promoter layer interposed between the passivation layer and the top surface of first copper pattern, and physically contacting the passivation layer and the top surface of the first copper pattern,
wherein the first adhesion promoter layer comprises an aluminum oxide layer, and
wherein the first adhesion promoter layer extends to be interposed between the first substrate body and the passivation layer.

2. The printed circuit board of claim 1, further comprising an adhesion assist layer interposed between the first adhesion promoter layer and the first copper pattern.

3. The printed circuit board of claim 2, wherein the adhesion assist layer comprises any one or any combination of titanium, titanium oxide, tungsten, cobalt, chromium, and copper oxide.

4. The printed circuit board of claim 1, wherein the epoxy-containing member comprises any one or any combination of a prepreg, a solder resist, and a mold layer.

5. The printed circuit board of claim 1, wherein the first substrate body comprises a recession in a top surface of the first substrate body, and
the first copper pattern is disposed in the recession.

6. The printed circuit board of claim 1, wherein the passivation layer comprises an opening that exposes either one or both of a first portion of the first substrate body and a second portion of the first copper pattern, and
the opening exposes a first sidewall of the passivation layer and a second sidewall of the first adhesion promoter layer.

7. The printed circuit board of claim 6, wherein the first adhesion promoter layer extends into the opening and covers the first substrate body.

8. The printed circuit board of claim 1, wherein the first copper pattern further has a side surface, and
the first adhesion promoter layer is interposed between the passivation layer and the side surface of the first copper pattern.

9. The printed circuit board of claim 8, wherein the first adhesion promoter layer has a uniform thickness on the top surface and the side surface of the first copper pattern.

10. The printed circuit board of claim 1, wherein the first copper pattern further has a bottom surface in contact with the first substrate body, and
the bottom surface of the first copper pattern has a first surface roughness greater than a second surface roughness of the top surface of the first copper pattern.

11. The printed circuit board of claim 10, wherein the bottom surface of the first copper pattern has a first ten-point mean roughness (Rz) ranging from about 1.5 μm to about 10 μm, and
the top surface of the first copper pattern has a second ten-point mean roughness (Rz) ranging from about from 0 μm to about 0.2 μm.

12. The printed circuit board of claim 1, further comprising a second adhesion promoter layer interposed between the first copper pattern and the first substrate body.

13. The printed circuit board of claim 12, further comprising:
a through via penetrating through the first substrate body and electrically connected to the first copper pattern; and
a third adhesion promoter layer interposed between the through via and the first substrate body.

14. The printed circuit board of claim 13, wherein the third adhesion promoter layer extends to be interposed between the first copper pattern and the through via.

15. The printed circuit board of claim 14, wherein the third adhesion promoter layer has a thickness ranging from about 0.1 nm to about 1 nm between the first copper pattern and the through via.

16. The printed circuit board of claim 1, wherein the epoxy-containing member further comprises a second substrate body disposed below the first substrate body, and
the printed circuit board further comprises:

a second copper pattern interposed between the first substrate body and the second substrate body; and a second adhesion promoter layer interposed between the second copper pattern and the second substrate body.

17. The printed circuit board of claim 16, wherein the second adhesion promoter layer extends to be interposed between the first substrate body and the second substrate body.

* * * * *